United States Patent [19]

Bolick, Jr. et al.

[11] 4,319,290

[45] Mar. 9, 1982

[54] DICTATION RECORDING AND TRANSCRIBING METHOD AND APPARATUS INCLUDING DISPLAY FOR MULTIPLE RECORDING MEDIA

[75] Inventors: Fred C. Bolick, Jr., Atlanta; Theodore Titus, IV, Tucker; Julius B. Bagley, Atlanta, all of Ga.

[73] Assignee: Lanier Business Products, Inc., Atlanta, Ga.

[21] Appl. No.: 78,231

[22] Filed: Sep. 24, 1979

Related U.S. Application Data

[63] Continuation-in-part of Ser. No. 970,357, Dec. 18, 1978, Pat. No. 4,247,876, and Ser. No. 27,990, Apr. 9, 1979.

[51] Int. Cl.³ ............................................. G11B 15/68
[52] U.S. Cl. ....................................... 360/92; 360/137
[58] Field of Search ................................. 360/137, 92

[56] References Cited

U.S. PATENT DOCUMENTS

| | | | |
|---|---|---|---|
| 3,661,394 | 5/1972 | Siller | 274/4 C |
| 3,672,683 | 6/1972 | Ban | 360/92 |
| 3,697,084 | 10/1972 | Ban | 360/92 |
| 3,810,239 | 5/1974 | Kozu et al. | 360/92 |
| 3,879,758 | 4/1975 | Pyles | 360/92 |

Primary Examiner—Robert S. Tupper
Attorney, Agent, or Firm—Jones, Thomas & Askew

[57] ABSTRACT

A system for recording or transcribing dictation including means for selectively placing any one of a plurality of recording media, such as tape cassettes, in a position for recording or transcribing dictation on the media, a means for displaying parameters of the dictation recorded on the particular medium in the recording or transcribing position, a means for storing the parameters of dictation on said medium when it is removed from the recording or transcribing position, and a means for again displaying the stored parameters when said medium is returned to the recording or transcribing position. Disclosed embodiments of the storage and display means include a mechanical means, an electrical means utilizing a separate memory for each recording medium, and an electrical means utilizing an addressable memory having particular memory locations for each recording medium.

7 Claims, 18 Drawing Figures

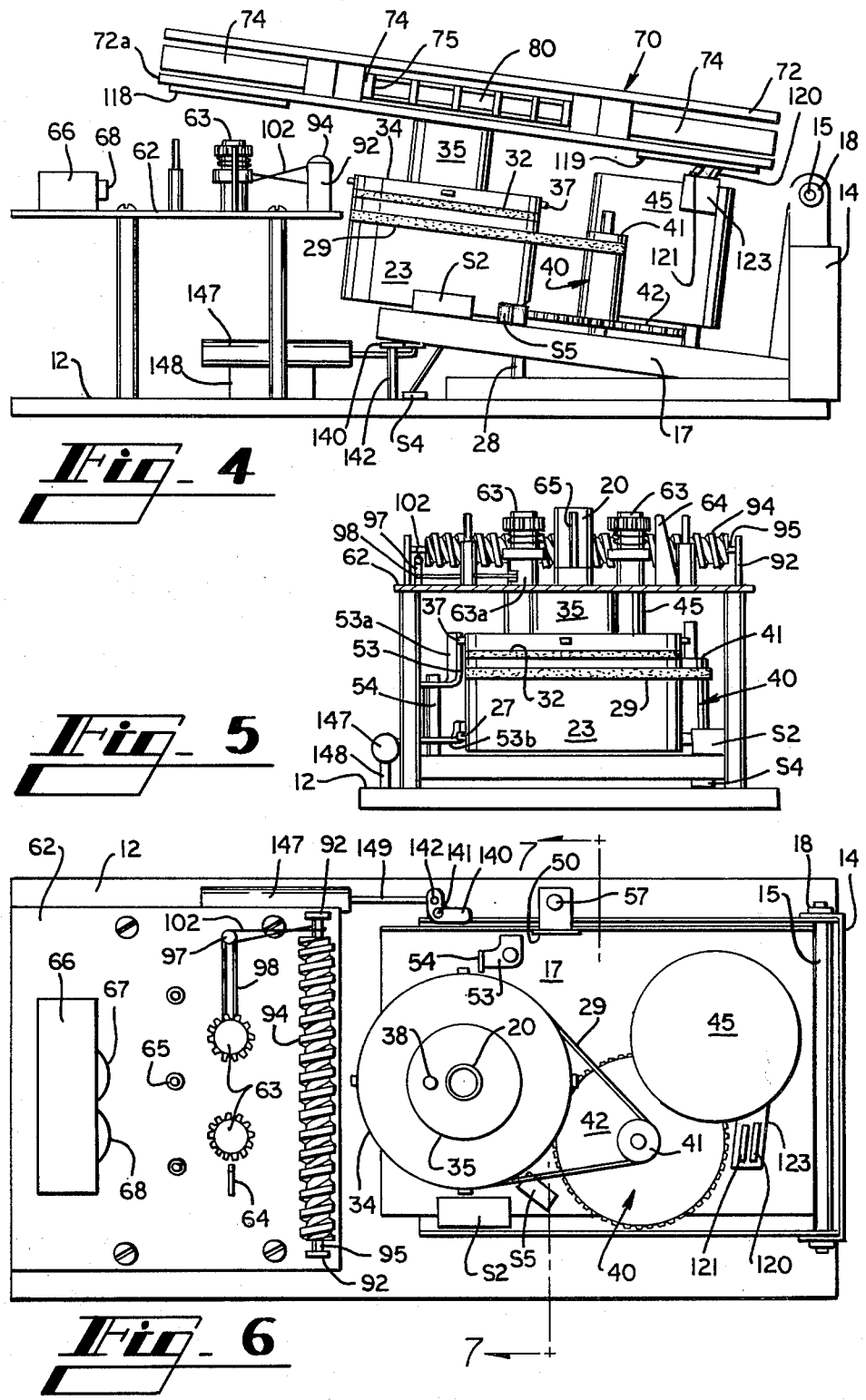

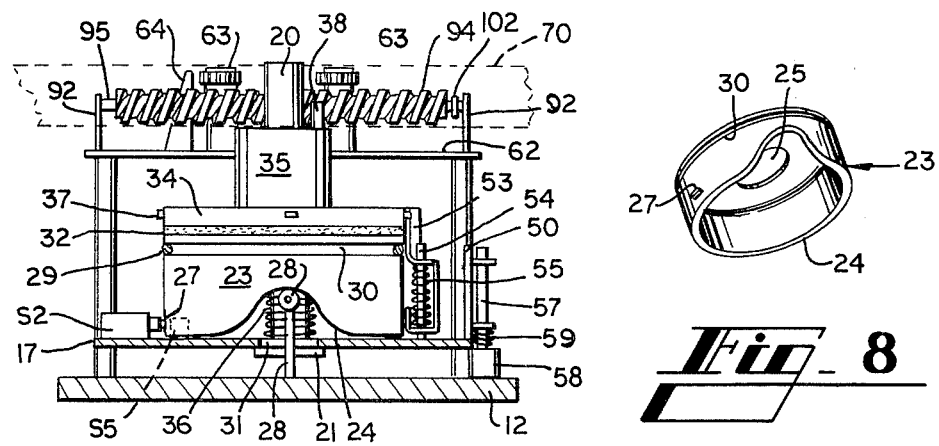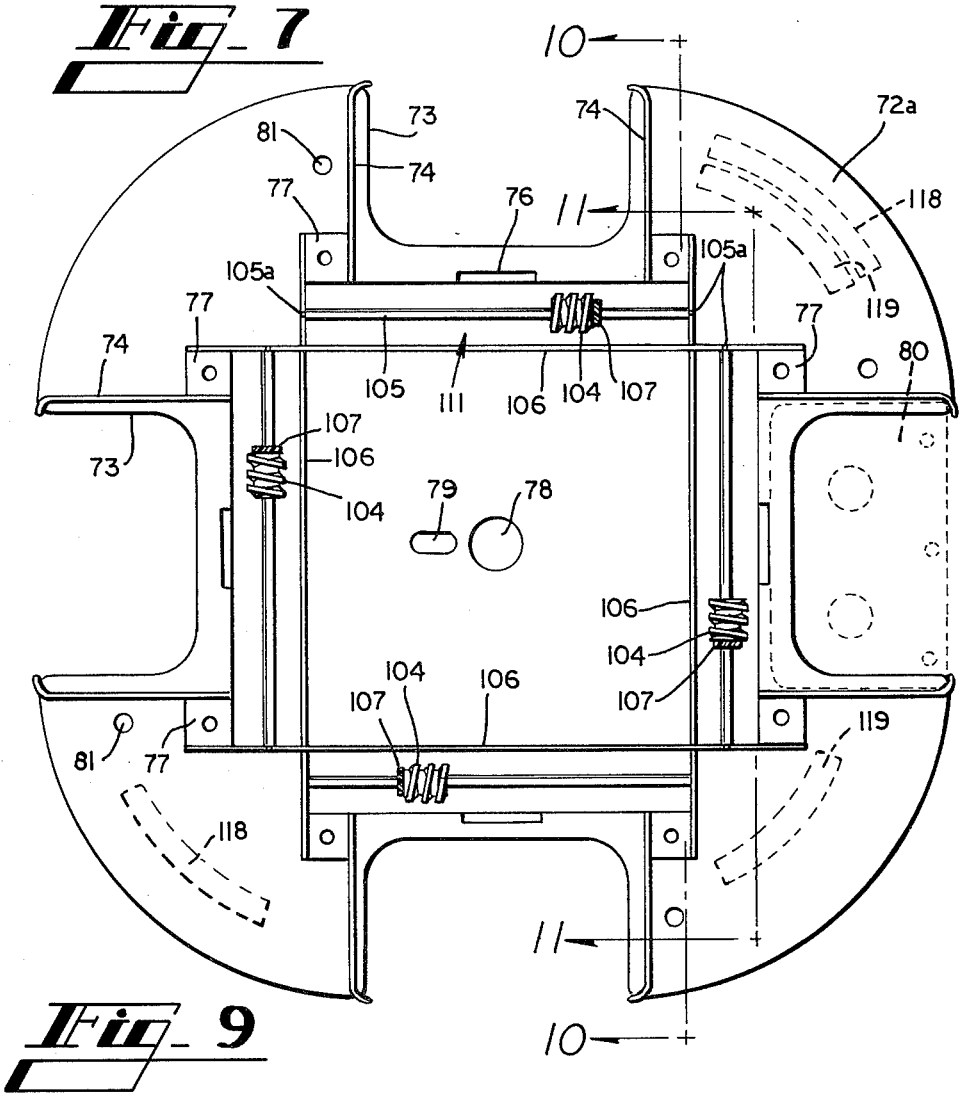

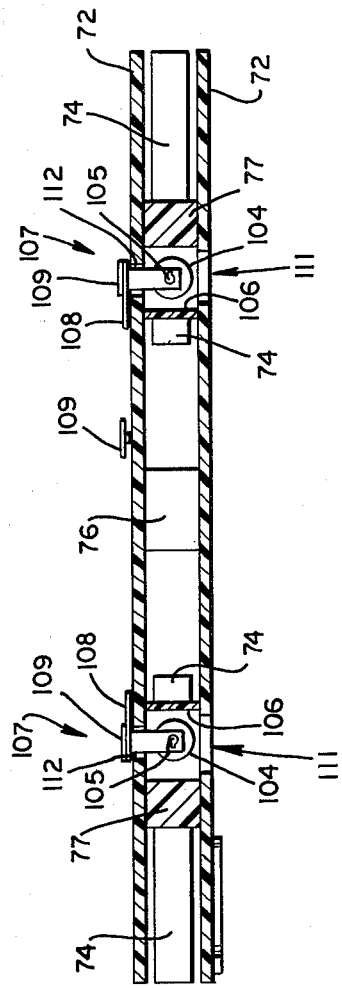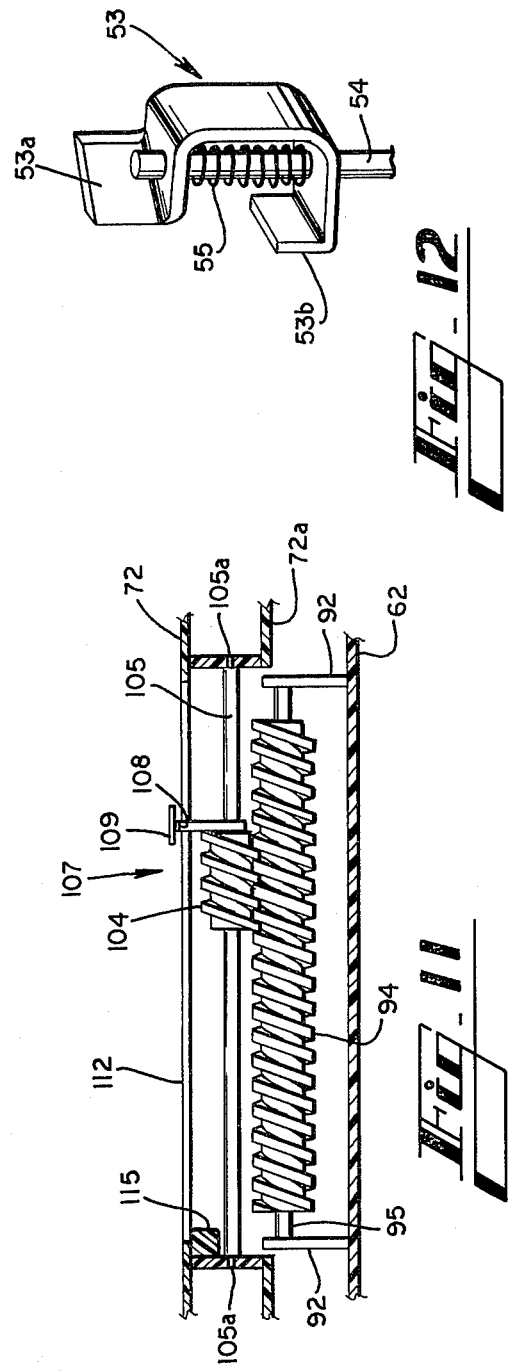

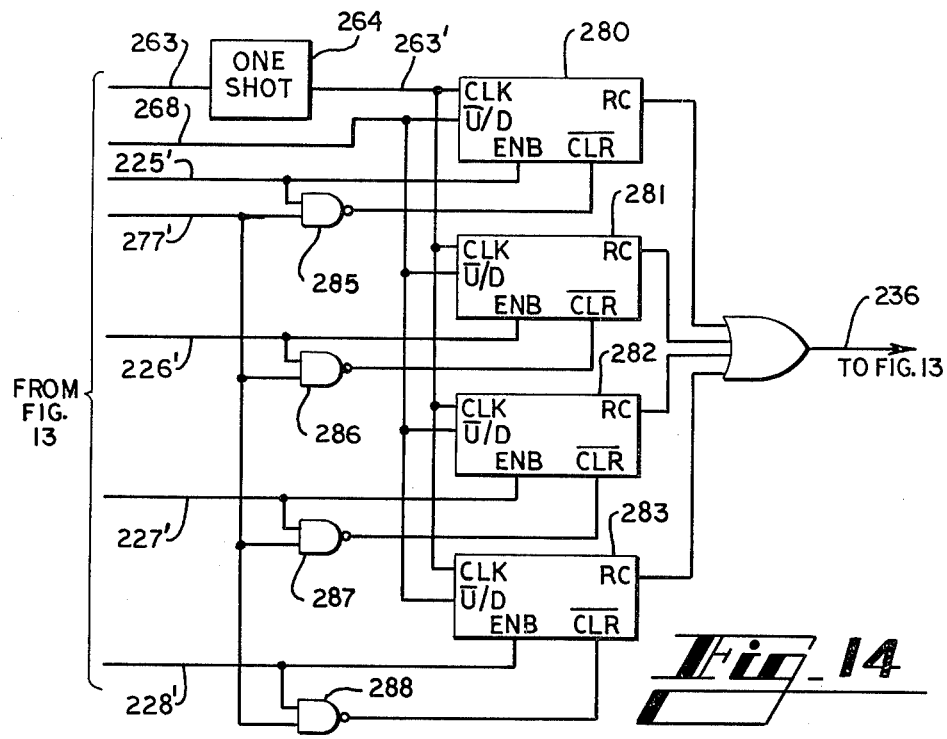
*Fig_14*
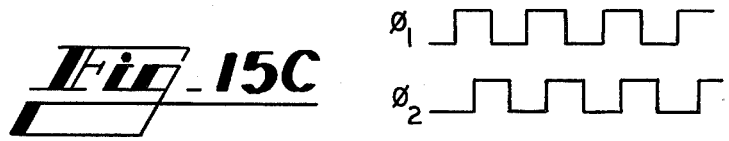
*Fig_15C*
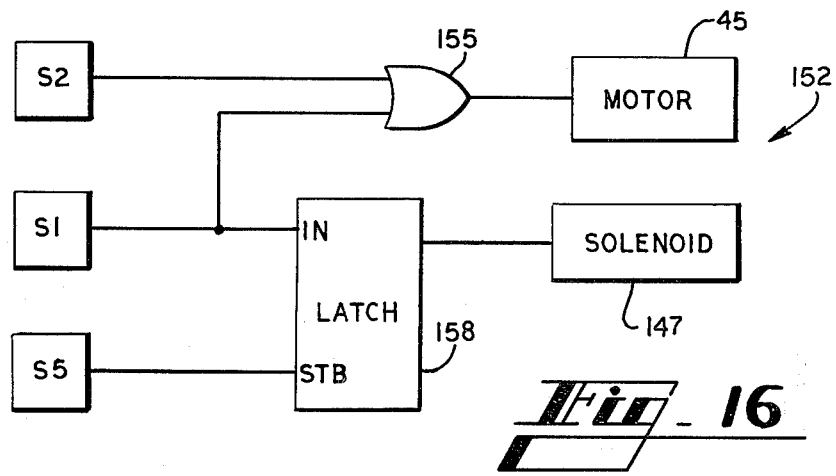
*Fig_16*

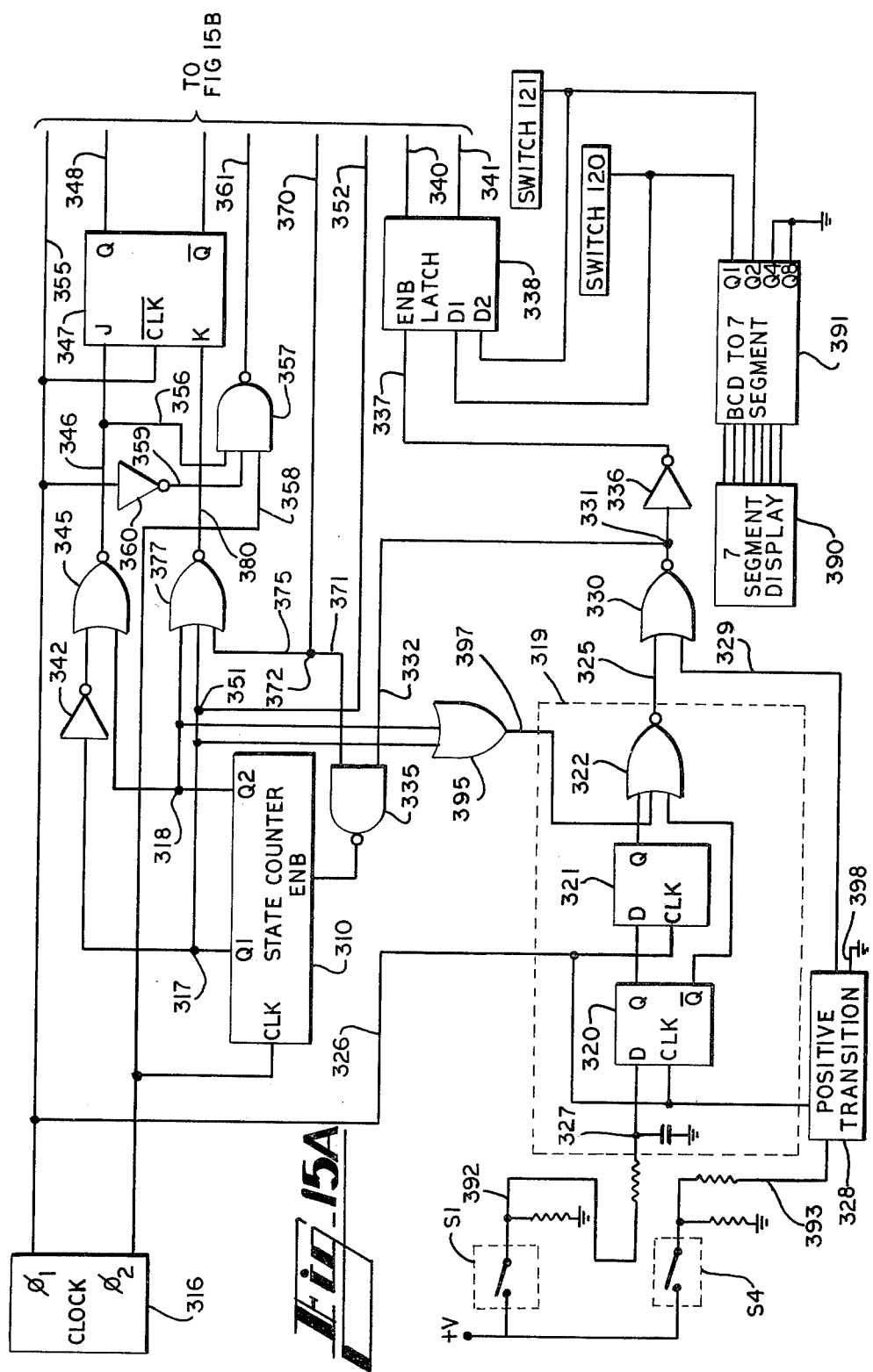

DICTATION RECORDING AND TRANSCRIBING METHOD AND APPARATUS INCLUDING DISPLAY FOR MULTIPLE RECORDING MEDIA

CROSS-REFERENCE TO RELATED APPLICATION

The present application is a continuation-in-part of U.S. application Ser. No. 970,357, now U.S. Pat. No. 4,247,876, filed Dec. 18, 1978, entitled "DICTATION RECORDING AND TRANSCRIBING SYSTEM UTILIZING A MULTIPLE MEDIA CARTRIDGE APPARATUS", and of U.S. application Ser. No. 027,990, filed Apr. 9, 1979, entitled "DICTATION DISPLAY DEVICE", both of said applications being assigned to the assignee of the present application.

TECHNICAL FIELD

This invention relates in general to recording systems, and in particular to a system for recording and transcribing dictation in which said dictation is recorded on discrete recording media such as tape cassettes.

BACKGROUND ART

Recent years have witnessed a significant growth in the popularity of dictation systems utilizing discrete recording media such as tape cassettes. The use of discrete media allows individual units of dictation to be recorded on separate media for individual access, for example, when a particular unit of dictation requires priority transcription. The advantage of individual access is particularly clear in comparison with prior art central dictation systems utilizing an endless loop of recording tape. In such systems, units of dictation are recorded sequentially and can be transcribed out of order only if the transcribing person passes over the intervening material to reach priority units of dictation and later rewinds the tape to transcribe the previously bypassed units of dictation. This procedure may be considerably time-consuming and requires a special apparatus to prevent the bypassed units of dictation from being inadvertently erased by subsequent dictation before the bypassed units of dictation are rewound for transcription.

The use of tape cassettes has a further advantage in that standard sizes such as the "C" size standard cassette or the "MC" microcassette, permit compatibility of the dictation system with other recording equipment such as portable dictation equipment and cassette tape recorders.

A significant problem with cassettes and other discrete media, however, is that the amount of dictation that can be recorded on a single cassette is limited. Thus, cassettes must be changed during dictation and a group of cassettes carrying a single long unit of dictation can become separated when transferred to a transcriber. Furthermore, no prior art dictation system has provided a capability for automatically giving access and reaccess to a number of cassettes, so that dictation can be recorded intermittently on each of several cassettes without manual handling of cassettes.

Standard sized tape cassettes have been utilized both in desk-top and central dictation/transcription systems. In one common form of desk-top system, both the dictating person and the transcribing person have similar desk-top units, each including a transducer head assembly for recording on or listening to a single tape cassette. Such a system requires a maximum of operator handling of individual tape cassettes. The cassettes must be carried from the dictating location to the transcribing location, and the dictating person must manually switch cassettes if it is desired to place an individual unit of dictation on a separate cassette. As work progresses, therefore, such a system generates a number of loose cassettes that must be catalogued and kept track of so that they are not lost and can be transcribed in the desired order.

The problem of handling individual cassettes becomes particularly acute for persons whose work requires intermittent attention to different types of work. For example, a person might need to dictate material related to several separate types of work each day, and further need to switch back and forth between types of work several times during the day. If dictation related to each type of work is to be recorded on an individual tape cassette, prior art dictation systems would require that the cassettes be manually switched in and out of the dictation apparatus. The dictating person would have to devote time and attention to organizing the loose tape cassettes so that they would be readily available the next time material was to be dictated related to particular types of work. Similarly, a person might have need of interrupting dictation to dictate a priority unit of dictation or to record a telephone call. Prior art dictation systems would again require handling and organizing of individual tape cassettes.

The prior art system shown in U.S. Pat. No. 4,113,994 utilizes a dual dictation recording and playback apparatus to reduce some of the manual delivery of tape cassettes between the dictating person and the transcribing person. A single unit located at the transcriber's desk contains two transport decks and associated record/listen transducers so that dictation may be recorded on one cassette while another is being transcribed. The dictating person has only a compact microphone and playback control. However, such an apparatus requires the dictating person to communicate with the transcribing person to manually provide a new tape cassette for dictation when such persons are simultaneously using the apparatus for dictation and transcription. Moreover, since a separate driving means and transducing means is required at each transport deck, considerations of size and cost place a limit upon the number of cassettes which can be made available without manual handling of cassettes.

Central cassette dictating apparatus, such as shown in U.S. Pat. No. 4,024,354, has provided apparatus for mechanically moving several individual tape cassettes into recording position in sequence. This allows the dictating person to move to a new tape cassette without handling cassettes, but restricts reaccess to cassettes containing previously recorded material. That is, it is impossible to intermittently accumulate dictation on a single cassette while also dictating on other cassettes. Thus, in order to provide for priority dictation and reaccess to partially completed dictation temporarily abandoned when the priority matter arose, it has been necessary to link two complete central dictation systems. Such a solution is not practical for a small office which cannot reasonably afford two central dictation systems, but which requires a capability for priority dictation.

A further disadvantage of such prior art central cassette dictating systems is that the mechanical apparatus provided includes at least two expensive cassette changing mechanisms which move individual cassettes into and out of a recording position. In addition to such mechanisms being expensive, cassettes may occasionally become jammed while being mechanically removed from a pre-dictation storage location, carried and loaded onto a transport deck for recording, and then unloaded and carried to a post-dictation storage location.

Some prior art devices designed only for playback of recorded music, such as those disclosed in U.S. Pat. Nos. 3,127,178 and 3,599,987, have provided better means for gaining access and reaccess to tape cassettes. Such improvements have not been incorporated into dictation recording and transcribing machines, there being in the art a preoccupation, motivated by practicality, with systems wherein each individual recording medium is preferably fully transcribed by a transcriptionist without intermittently transcribing information recorded on several media.

Such playback systems for music further fail to provide for storing parameters of dictation recorded on each medium and for displaying such parameters when such medium is placed in position for further recording or transcribing. Without such information, a person desiring to add recorded material to the medium, alter previously recorded material, or transcribe recorded material, cannot accurately determine how much of the medium has been previously utilized. Neither can such person determined where particular units of dictation begin and end, nor where instructions regarding dictated material may be located.

SUMMARY OF THE INVENTION

The foregoing problems in prior art dictating and transcribing systems are solved by the present invention which displays stored information comprising parameters of dictation previously recorded on any of the recording media when each such medium is placed in a record/listen position. The storage and display feature of the invention is independent of the means by which recording media are removed from and returned to the record/listen position. The invention also allows a dictating or transcribing person immediate automatic selective access to any one of a plurality of individual recording media with the access being in any order and being repeated as often as it is desired to record or transcribe material on each of the individual recording media. The invention provides this improvement with cassettes carried in a cartridge that is manipulated to selectively place any of the recording media in the record/listen position.

Generally described, the present invention comprises, in a dictation/transcription apparatus including a means for removably receiving a discrete recording medium at a record/listen position for recording or listening to dictation on the recording medium such that the recording medium can be selectively removed and returned to the record/listen position, the improvement of a storage means for storing a signal corresponding to the current status of the dictation on the recording medium, the storage means being operative to store the signal independent of the presence of the medium in the record/listen position, and display means responsive only to the presence of the medium in the record/listen position for displaying a visual representation of the signal.

More particularly described, the present invention can comprise, in a dictation recording and transcribing system, a cartridge means for releasably retaining at least a first recording medium at a first location in the cartridge means and a second recording medium at a second location in the cartridge means, a means for selectively moving the cartridge from a first position wherein said first location is in a predetermined orientation relative to a record/listen transducer to a second position wherein said second location is in the same predetermined orientation relative to the record/listen transducer and for selectively returning the cartridge to the first position, a storage means for storing parameters of dictation recorded on the first recording medium when the cartridge is moved away from the first position, and a display means responsive to the cartridge being returned to the first position for displaying the parameters of dictation recorded on the first recording medium.

The cartridge means can carry any desired number of recording media, such as tape cassettes, and comprises a housing including a plurality of means for removably receiving the plurality of recording media at separate predetermined locations within the housing. The means for positioning the cartridge includes a single cartridge changing mechanism which transports the plurality of recording media simultaneously to place any one of the media at a particular location for recording or transcribing.

The housing of the cartridge means can be of a variety of shapes and can be manipulated in a variety of ways within the scope of the invention to place different recording media carried by the cartridge in the record/listen position. It is within the concept of the invention to provide relative movement between the cartridge and the transducer by moving only the cartridge, or only the transducer assembly, or by providing one direction of relative motion by movement of the cartridge and another direction of relative motion by movement of the transducer assembly.

Preferably, the housing of the cartridge is rotatably driven about its center and slidably receives said recording media in positions radially disposed about the center of the housing equidistant therefrom in a single plane. Shifting between recording media may therefore be accomplished by raising the cartridge to lift a recording medium from the record/listen position relative to the transducer, rotating the cartridge until another selected recording medium is positioned above the record/listen position, and then lowering the cartridge to place the new recording media in the record/listen position with respect to the transducer.

Although the cartridge is removably mounted in the apparatus to permit a cartridge to be utilized in more than one apparatus, it is contemplated that it may be fixedly positioned with respect to the apparatus.

In a simple form, the storage and display means include a mechanical means, mounted in the cartridge and removably coupled to the tape drive means which drives a tape within a cassette, for moving a pointer along a scale at a rate related to the rate of use of tape. The cartridge carries one pointer for each tape cassette, and such pointer is automatically coupled to the tape drive means whenever the corresponding cassette is placed in the record/listen position. The pointer thus indicates how much of the tape within the cassette has been wound from an initial position, and stores such information when the cassette is removed from the record/listen position.

The invention also includes use of an electrical storage and display means in which a designated portion of storage is used to store signals corresponding to the current state of the display for each cassette. Two embodiments using electrical storage and display means are disclosed. In one such embodiment, signals related to movement of tape within a cassette in the record/listen position are displayed and also stored in storage media such as shift registers, there being one storage medium for each cassette location in the cartridge. When a cassette location is removed from the record/listen position the state of the associated storage medium remains constant until that cassette location is returned to the record/listen position. Then the associated storage medium is again connected to display the stored information and to store additional information related to the position of the tape within the cassette.

In the second embodiment using an electrical storage and display means, signals related to movement of the tape within a cassette in the record/listen position are visually displayed and also stored in a display memory until the cassette is removed from the record/listen position. At this time the stored information is stored in a particular location in an addressable memory so that a single display memory can be used for each cassette location in the cartridge. The information stored in the addressable memory location associated with the particular cassette location is returned to the display memory and visually displayed the next time the cassette location is returned to the recording position.

The system of the invention thus provides random, intermittent and controlled access and reaccess to any of several recording media using a single, uncomplicated transport apparatus, substantially overcomes the problems of excessive manual handling of recording media which accompanies the use of prior art systems, and stores and displays parameters of dictation to provide the operator with information relating to the current status of a parameter of dictation (or transcription) as dictation or transcription is progressing, and as it existed when the operator interrupted work on a particular recording medium if the medium is removed from the record/listen position and later returned. For example, a dictating person with a need for separation of various types of work may dictate on a separate tape cassette for each type of work and shift back and forth between types of work easily by operating the controls of the present system to move the cartridge to place the appropriate cassette in recording position. Likewise, if a dictating person needs to interrupt a unit of dictation to record a phone call or to dictate a priority unit of dictation, the person need only operate the cartridge mechanism to gain access to a fresh cassette, and thereafter to switch back to the cassette on which the original unit of dictation was being recorded. The storage and display feature of the invention informs the person at what point along the original cassette dictation was left off, and then continues to display the position of the tape within the cassette, whether the tape is advanced or rewound.

Furthermore, the system provides for shifting between recording media without mechanically handling the individual recording media, since the media are temporarily fixed with respect to the cartridge during operation, and only the cartridge as a whole is shifted by the mechanical apparatus. Manual delivery between the dictating person and the transcribing person is also substantially reduced, since only cartridges containing a plurality of recording media need be delivered. Parameters of dictation are appropriately stored and displayed to facilitate dictation or transcription as well as shifting between recording media.

Thus, it is an object of the present invention to provide a dictating and transcribing system wherein individual recording media are carried by a cartridge and may be selectively positioned for recording and listening by mechanical manipulation of the cartridge rather than each individual recording medium.

It is a further object of the present invention to provide a dictating and transcribing system utilizing discrete recording media such as tape cassettes, and which minimizes manual handling of the recording media and eliminates separate mechanical handling of each individual medium.

It is a further object of the present invention to provide a dictating and transcribing system utilizing individual recording media and wherein reaccess to previously recorded media may be easily obtained without manual handling of the media or separate mechanical handling of each individual medium.

It is a further object of the invention to provide a dictating and transcribing system wherein standard tape cassettes are removably retained in a cartridge which simultaneously moves said cassettes to place one of said cassettes in a recording and/or transcribing position wherein a rotatable projection is inserted into an opening in said cassette.

It is a further object of the invention to provide a dictating and transcribing system wherein parameters of dictation for each of several recording media are displayed for each cassette when it is in an operative position, stored when each cassette is removed from the operative position, and again displayed when each cassette is returned to the operative position.

It is a further object of the present invention to provide a cartridge removably carrying a plurality of recording media and adapted for movement relative to a transducer assembly in order to alternately place any of said recording media in a recording or playback position relative to the transducer assembly.

Other objects and advantages of the present invention will become more apparent from the following description of a disclosed embodiment of the invention, when taken in conjunction with the drawing and the appended claims.

BRIEF DESCRIPTION OF THE DRAWING

FIG. 4 is a right side view of the cassette changer apparatus shown in FIG. 1, showing a cassette cartridge of the type shown in FIG. 2 mounted on the apparatus in a raised position.

FIG. 5 is an end cross-sectional view of the cassette changer apparatus taken along line 5—5 of FIG. 3.

FIG. 6 is a top view of the cassette changer apparatus shown in FIG. 1.

FIG. 7 is a vertical cross sectional view of the cassette changer apparatus shown in FIG. 1, taken along line 7—7 of FIG. 6.

FIG. 8 is a pictorial view of the cam of the cassette changer apparatus.

FIG. 9 is a top view of the cartridge shown in FIG. 2, with the top plate of the cartridge removed.

FIG. 10 is a side cross-sectional view of the cartridge of FIG. 9 taken along line 10—10 of FIG. 9.

FIG. 11 is a side cross-sectional view of the cartridge taken along line 11—11 of FIG. 9 and showing the cartridge in a recording position with respect to the tape transport deck.

FIG. 12 is a pictorial view of a pivot link used to start and terminate rotational motion of the cartridge by the cassette changer apparatus shown in FIG. 1.

FIG. 14 is a circuit diagram of a preferred embodiment of the scaler of FIG. 13.

FIGS. 15A and 15B are circuit diagrams of an alternative circuit for providing electrical storage and display parameters of dictation in a third embodiment of the present invention.

FIG. 15C is a timing diagram of the two phase clock of FIG. 15A.

FIG. 16 is a circuit diagram of an embodiment of a control circuit for controlling the selective operation of the cassette changer apparatus to place a desired cassette in the record/listen position.

DETAILED DESCRIPTION

Figure 1:
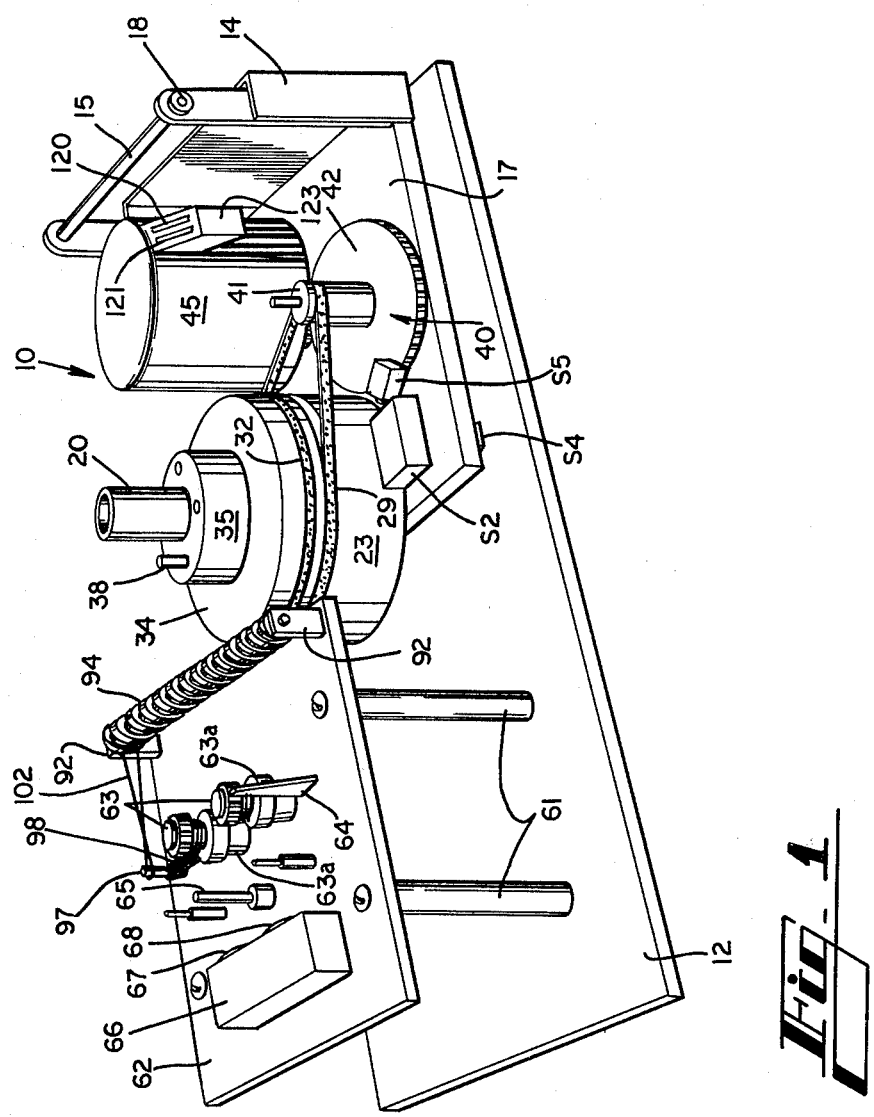
FIG. 1 is a pictorial view of a cassette changer apparatus of an embodiment of the present invention.

Referring now in more detail to the drawing, in which like numerals refer to like elements throughout the several views, FIG. 1 shows the cassette changer apparatus 10 which, in conjunction with either a mechanical or an electrical storage and display means, embodies the present invention. The changer apparatus 10 includes a rectangular base 12, across the width of which at one end thereof is mounted a pivot rod support member 14 carrying a pivot rod 15 elevated above the base 12. A movable L-shaped frame 17 is pivotally attached at one end thereof to the pivot rod 15 by a pair of pivot bearings 18. Thus, the branch of the "L" attached to the pivot rod 15 is disposed generally vertically, and the other branch extends generally horizontally over the base 12. Near the end of the horizontal portion of the frame 17 furthest from the pivot rod support 14, a generally vertical shaft 20 is fixed to the frame 17 by a shaft nut 21, as shown in FIG. 7.

A cam 23, shown in FIGS. 1, 3-5, 7 and 8, is rotatably mounted on the vertical shaft 20. The cam has the shape of a short cylinder with its upper end enclosed, as shown in FIG. 8. The shaft 20 passes through a shaft-engaging opening 25 in the enclosed upper end of the cam 23, and a cam surface 24 is defined by the edge of the cylinder at its open end. The length of the cylinder varies so that for one-half of its circumference, the cam surface 24 remains a fixed distance from the enclosed end of the cam cylinder. Along the other half of the circumference of the cam, the cam surface 24 approaches the enclosed upper end of the cam cylinder. A cam follower 28 is mounted on the base 12 and extends through an opening 31 in the movable frame 17 to engage the cam surface 24, as shown in FIG. 7. As the cam rotates, the cam 23 and cam follower 28 cooperate to lift the frame 17 from a lowered position (shown in FIGS. 3 and 7) to a raised position (shown in FIG. 4).

The cam 23 also includes cam trip 27 projecting from the cylindrical surface of the cam. A cam limit switch S2 mounted adjacent to the cam on the frame 17, is engaged by the trip 27 when the cam 23 (and therefore the frame 17) is at rest in a fully lowered position. The switch S2 is of a type that is closed when released. Another switch S5 is also included which is momentarily closed by trip 27 once during early rotation of the cam. The cam 23 also includes a cam belt groove 30 about the circumference of the cam, the groove 30 receiving a cam belt 29 to drive the cam 23 in a clockwise direction. A limit switch S4 is mounted on the base 12 under the frame 17, and if necessary is embedded or recessed into the base 12 so that the switch S4 is closed when the frame 17 is lowered. The throw of switch S4 is spring loaded upwardly and designed such that switch S4 does not open until the frame 17 has been lifted to its raised position. The purposes of switches S2 and S4 will be disclosed in detail hereinafter.

Figure 2:
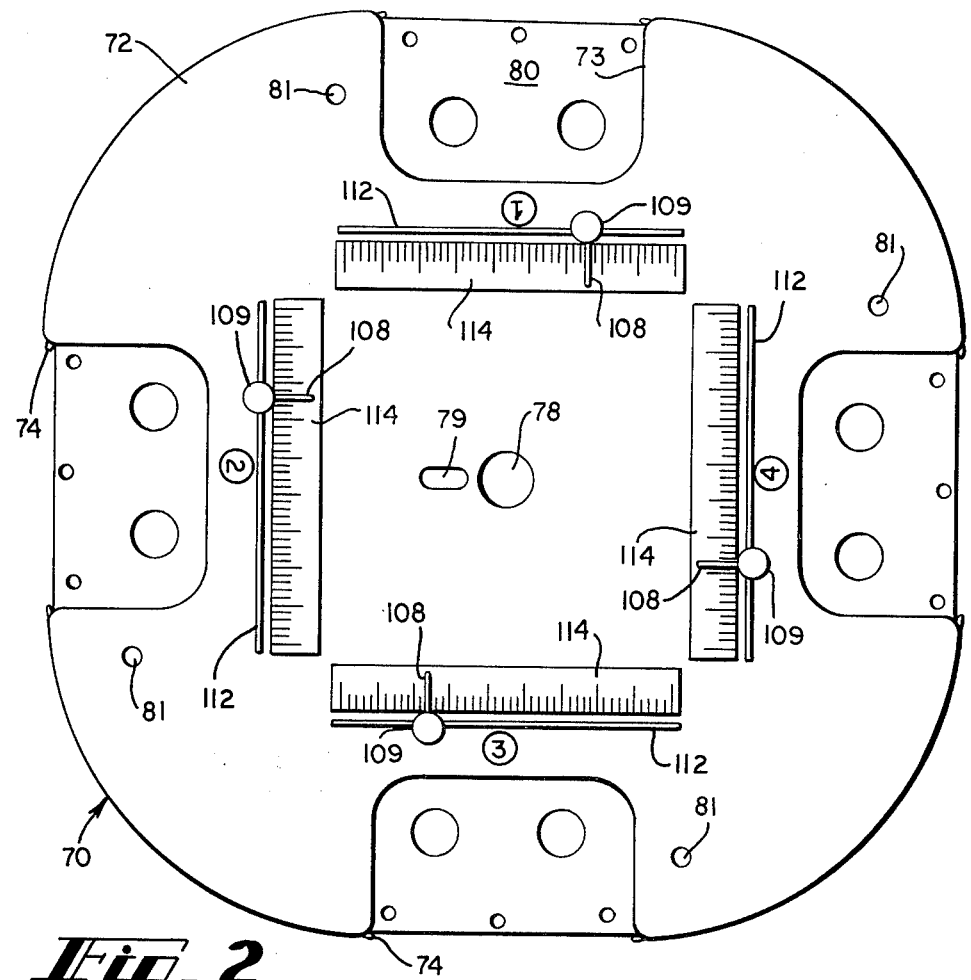
FIG. 2 is a top plan view of a cartridge for use in conjunction with the apparatus shown in FIG. 1, carrying four tape cassettes.
Figure 3:
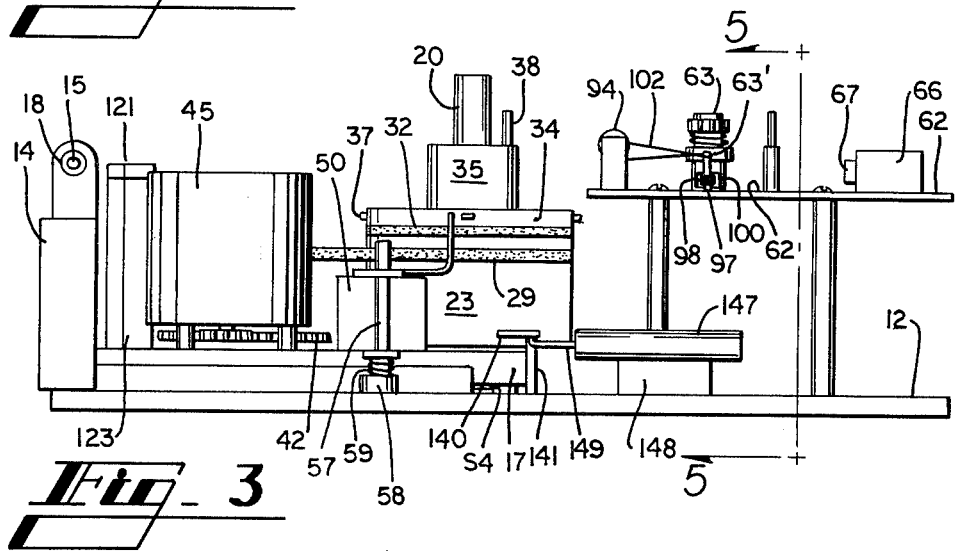
FIG. 3 is a left side view of the cassette changer apparatus shown in FIG. 1.

Also mounted on the vertical shaft 20 immediately above the cam 23, are a clutch 32, a clutch-engaging member 34, and a cartridge support member 35. The clutch-engaging member 34 and the cartridge support member 35 are fixed to one another and are together rotatably mounted on the shaft 20. A clutch biasing spring 36 biases the cam 23 against the clutch-engaging member 34. Thus, when the cam 23 is rotated about the shaft 20, the cartridge support member 35 tends to rotate with the cam. The cartridge support member 35 includes a vertically extending cartridge locator key 38 to properly position a cartridge 70 placed on the cartridge support member 35 by extending into an opening in the cartridge, and to carry the cartridge with the support member 35 as it rotates. The cartridge 70, as shown in FIGS. 2, 4 and 9, includes a plurality of cassette locations, each for retaining a tape cassette. The clutch-engaging member 34 of the present embodiment includes four cartridge motion stops 37 extending from the circumference of the clutch-engaging member 34 spaced at equal intervals 90° apart around the cartridge motion stops 37. It will be understood that the number of clutch-engaging members 34 will correspond to the number of tape cassettes or other recording media carried by the cartridge 70.

A cam drive pulley 40 is rotatably mounted on the frame 17 next to the cam 23. A small diameter upper member 41 of the pulley 40 carries the cam belt 29. A larger diameter lower member 42 of the pulley 40 forms a gear which is driven by a drive gear (not shown) at the base of a DC motor 45. The DC motor 45 may alternately drive the pulley 40 by means of a belt similar to the belt 29. The DC motor 45 is operated by a power supply (not shown).

A pivot link 53 is pivotally mounted adjacent to the cam 23 on a vertical axle 54 extending upwardly from the frame 17. The unitary pivot link 53 includes a brake member 53a formed at the upper end of the pivot link 53 and a trigger member 53b formed at the lower end of the pivot link 53, as shown in FIG. 12. A spring 55 biases the pivot link 53 in a clockwise direction into a position wherein the brake member 53a lies in the path of the cartridge motion stops 37 and the trigger member 53b lies in the path of the cam trip 27, as best shown in FIGS. 6 and 7. Thus, when the cam 23 rotates, the cam trip 27 engages the trigger member 53b, rotating the pivot link 53 against the bias of the spring 55, and thereby removing the brake member 53a from the path of the cartridge motion stops 37. This allows the slip clutch 32 to carry the clutch-engaging member 34 with the cam 23. Since the cam trip 27 displaces the pivot link 53 only momentarily, the brake member 53a is urged back into place near the circumference of the clutch-engaging member 34 by the spring 55, so that when the next stop 37 arrives at the position of the pivot link 53, the motion of the clutch-engaging member 34 will again be arrested. Clearly, the force of the spring 55 must be sufficiently great to overcome the tendency of the clutch 32 to move the clutch-engaging member 34.

In order to ease the descent of the frame 17 from a raised to a lowered position as the cam 23 rotates, a dash pot 57 having the foot 58 extending therefrom and biased outwardly by a spring 59, is mounted on a vertical support bracket 50 at the side of the frame 17. The bracket 50 is thus carried up and down by the frame 17. As the frame 17 is lowered by the cam, the foot 58 engages the base 12 and eases the frame 17 into a lowered position.

The cassette changer apparatus 10 also includes a means for selectively holding the frame 17 in its raised position regardless of the rotation of the cam 23. As shown best in FIGS. 3 and 6, this means is provided by an "L" shaped pivoted latch 140 pivotally mounted at the bend of the "L" on a vertical pivot axle 141 which is fixed to the base 12 immediately adjacent to the side of the frame 17. The latch 140 is mounted on the axle 141 at a height such that the latch 140 can be pivoted under the frame 17 when the frame 17 is in a fully raised position, and can carry the weight of the frame 17 to maintain the frame 17 in a fully raised position. The insertion of the latch 140 under the frame 17 is accomplished by means of a solenoid 147 which is mounted on a support bracket 148 to the base 12 in a location such that a position rod 149 extending horizontally from the solenoid 147 can be pivotally connected at 142 to the arm of the "L" shaped latch 140 that extends away from the frame 17. When power is applied to the solenoid 147 by a control circuit to be described hereinafter, the piston rod 149 extends out of the solenoid 147, causing the other arm of the "L" shaped latch 140 to be pivoted under the frame 17. When the power to the solenoid 147 is cut off, a spring (not shown) within the solenoid 147 retracts the piston rod 149 to pivot the latch 140 out from beneath the frame 17. Operation of the solenoid 147 and latch 140 allow the operator to change from one cassette location directly to another cassette location not immediately adjacent to the original location, in a manner to be described hereinafter.

Mounted to the base 12 beyond the end of the horizontal portion of the frame 17 is a tape transport deck 62 supported on a plurality of transport deck support legs 61. The tape transport deck 62 carries a tape transport mechanism well-known to those skilled in the art. The mechanism includes rotatable projections for driving cassettes, namely, a pair of spindles 63, enclosed in housings 63a, and a capstan 65. The deck 62 also includes a tapered locator key 64 for engaging a cartridge 70 and guiding it into proper position with respect to the transport mechanism, and a movable transducer head assembly 66 which includes a pinch roller 67 for engaging the capstan 65, and a record/listen head 68. A means (not shown) is provided for slidably moving the transducer head assembly 66 into and out of engagement with a tape cassette placed in a record/listen position on the tape transport deck 62, in a conventional manner known to those skilled in the art, wherein the pinch roller 67 and head 68 enter apertures in the wall of the cassette.

Also mounted on the tape transport deck 62, near the edge of the deck 62 nearest the frame 17 is a worm gear 94. The worm gear 94 is rotatably carried by an axle 95 which is journaled into a pair of axle supports 92 mounted at the opposite sides of the deck 62, as shown in FIG. 6. In order to coordinate the rotation of the worm gear 94 with the movement of the tape by the spindles 63, the worm gear 94 is driven directly from one of the spindles 63. A belt 98 engages the shaft of one of the spindles 63 and drives a dual pulley 97 mounted on the deck 62. The belt 98 extends through an opening 100 in the spindle housing 63a. A twisted belt 102 drivingly connects the dual pulley 97 to the shaft 95 of the worm gear 94, so that the rotational movement of the spindle 63 about a vertical axis by its power means (not shown) is translated into rotational motion of the worm gear 94 about a horizontal axis. As will be seen from FIG. 11, the supports 92 position the worm gear 94 at a height above the deck 62 such that the uppermost point of the worm gear 94 is higher than the lowermost surface 72a of the cartridge 70 when the cartridge is lowered into a recording position.

In the present invention, individual recording media are carried by a cartridge 70, as shown in FIGS. 2 and 9. The cartridge 70 includes a pair of retaining members in the form of upper and lower parallel plates 72 and 72a, each including a plurality of cutouts 73, radially disposed about the center of the cartridge 70. Disposed between the parallel plates 72 and 72a at either side of each cutout 73 are a pair of flexible guides 74. The guides 74 are spaced apart approximately the length of a standard cassette. In the embodiment shown, standard microcassettes 80 are utilized. The inner ends of the guides 74 are attached to blocks 77 which serve to attach the parallel plates 72 and 72a to one another and to support the guides 74. The guides 74 each include a small projection 75 at the outer end of the guide 74 extending toward the cutouts 73. A rear stop 76 is located inwardly of each cutout 73 approximately the width of a standard microcassette 80 from the projections 75 on the flexible guides 74. Thus, a standard microcassette 80 may be slidably inserted between the parallel plates 72 and 72a and between a pair of the flexible guides 74 until the cassette meets a rear stop 76. The flexible guides 74 are biased against the sides of the microcassette, and therefore the projections 75 on the guides 74 removably retain the microcassette within the cartridge 70 at a fixed cassette location. Alternately, one of each pair of guides 74 may be rigid and the other guide flexible, so that the guides will still press against the sides of the microcassette, but the microcassette will be more accurately positioned within the cartridge than when both guides are flexible. The cutouts 73 are somewhat smaller in area than the cassettes, so that the parallel plates 72 and 72a restrain the cassettes, but the openings in the cassettes are exposed for insertion of the rotatable spindles 63 and capstan 65 of the transport mechanism, and the cassettes may still be grasped at the location of the cutouts 73 for insertion and removal of the cassettes into and out of the cartridge 70.

The cartridge 70 also includes a shaft opening 78 at the center thereof so that the cartridge 70 may be placed over the vertical shaft 20 and come to rest upon the cartridge support member 35, as shown in FIG. 4. A keyway 79 is provided to receive the cartridge locator key 38 on the cartridge support member 35. Furthermore, a positive locator keyway 81 is located adjacent each cassette position in the cartridge 70. Each locator keyway 81 receives the locator key 64 mounted on the transport deck 62 when the cartridge 70 is lowered onto the tape transport deck 62 with the associated cassette location positioned over the deck 62. The tapered nature of the locator key 64 guides the cartridge 70 into precise alignment with the transport deck 62, rather than relying on the dead stop of the cartridge motion stops 37 against the pivot link 53.

MECHANICAL STORAGE AND DISPLAY

In one embodiment of the invention, shown in FIGS. 9-11, the cartridge 70 includes a plurality of mechanical memory devices for storing a parameter of the dictation recorded on the cassettes carried by the cartridge, namely, the amount of the tape within a cassette that has been wound past the head 68 from an initial position. The memory devices similarly store the amount of tape that has been wound past a listen transducer if the apparatus is being used by a transcriptionist. One such mechanical memory is provided for each cassette location within the cartridge 70. The parameter of net length of tape that has moved past the record/listen head 68 is stored by moving a pointer 108 along a scale 114 which is visibly located on the top surface of the cartridge 70 (FIG. 2). The pointer 108 is moved across the scale 114 at a rate related to the movement of tape by the capstan 65 on the tape transport deck 62. The markings on the scale can be calibrated to indicate a percentage or a length in appropriate units, with full scale corresponding to movement of all of the tape in a standard cassette past the record/listen head 68.

When a cassette changer embodying the invention includes such mechanical memory devices, the identification of each cassette location is provided by visual indicia (numerals) on the upper surface of the cartridge is shown in FIG. 2. If a cover (not shown) is provided for the apparatus, appropriate windows can be provided to allow the operator of the apparatus to see which cassette position is approaching or is already in the recording position.

In order to coordinate the movement of the pointer 108 with the movement of the tape, the cartridge 70 includes a plurality of pinion gears 104, each mounted on a keyed shaft 105. The keyed shafts 105 are pivotally mounted from a set of intersecting walls 106, shown in FIG. 9, the walls 106 extending between the parallel plates 72 and 72a of the cartridge 70. The pinion gears 104 and the keyed shafts 105 are located behind each cassette location in the cartridge 70, extend parallel to the length of the cassettes, and are exposed from the bottom of the cartridge 70 by openings 111 which extend the length of the keyed shafts 105 in the lower of the parallel plates, 72a. Although the keyed shaft 105 prevents the pinion gear 104 from rotating about the shaft 105, the gear 104 is slidably movable along the shaft 105. Preferably, the mating opening in the gear 104 which receives the keyed shaft 105 is lined with a clutch-like material so that the gear 104 may be slidably moved along the shaft 105 under manual or mechanical pressure, but will not slide freely of its own weight.

Attached to each gear 104 is a pointer assembly 107, oriented so that the pointer assembly 107 extends vertically upward with respect to the cartridge 70 through an opening 112, running the length of the shaft 105, in the upper of the parallel plates, 72. At the upper end of the assembly 107 is attached the pointer 108 extending horizontally over the scale 114, and a knob 109 which may be used to manually slide the pinion gear and pointer assembly along the keyed shaft 105. The keyed shaft 105 is pivotally mounted to the walls 106 by means of pivot pins 105a which are eccentric to the keyed shaft and located in the upper half of the circular portions thereof, as shown in FIG. 11. Therefore, the pinion gear and pointer assembly will naturally seek a particular position according to their center of gravity, but may be tilted out of such position by exerting pressure on the knob 109 perpendicular to the length of the shaft 105 to rotate the shaft, pinion gear and pointer assembly about the axis of the pivot pins 105a.

The position of the keyed shaft 105 within the cartridge 70 is selected such that when the cartridge 70 is lowered by the mechanism 10 to place a cassette in a record/listen position with respect to the tape transport deck 62, the worm gear 94 mounted on the deck 62 will extend slightly into the opening 111 in the bottom of the cartridge 70 and engage the pinion gear 104, as shown in FIG. 11. Thus, when the worm gear 94 is rotatably driven off the spindle 63, the pinion gear 104 will be carried along the worm gear, causing the pointer assembly 107 to move with the gear 104 linearly along the keyed shaft 105.

In order to reset the pointer at the zero point along the scale 114 or to any other point along the scale, the operator can tilt the pointer assembly and pinion gear 104 about the pivot pins 105a to disengage the pinion gear 104 from the worm gear 94, and then, while the assembly is tilted, slide the assembly along the keyed shaft 105 to the desired position. When the pointer 108 is located at the desired position along the scale 114, the knob 109 can be released, allowing the pinion gear 104 to fall into a position once again engaging the worm gear 94.

The lower surface of the lower of the parallel plates 72a of the cartridge 70 includes a plurality of raised cams 118 and 119. The position of such cams 118 and 119 is shown in dotted lines in FIG. 9, which is a top plan view of the cartridge 70 with the upper of the parallel plates, 72, removed. The cams 118 and 119 are either present or absent in two locations having a predetermined relationship to each cassette location in the cartridge 70. Specifically, the cam locations for cam 118 are arcuate paths extending between the guides 74 of adjacent cassette locations in the cartridge 70. The paths of the cams 119 are parallel arcs slightly closer to the center of the cartridge 70 than the arc traversed by cams 118. All of the cams 118 are along a circle which passes over a limit switch 120 mounted on a support 123 which is in turn mounted on the frame of motor 45. Likewise, the cams 119 are along a circle passing over a limit switch 121 which is mounted on the support 123. Thus, as the cartridge 70 rotates, the cams 118 and 119 engage the limit switches 120 and 121 as cassette locations approach vertical alignment with the tape transport deck 62. The cam positions shown in FIG. 9 are associated with a particular cassette location located approximately 145 degrees counterclockwise around the cartridge from that cassette location. In the embodiment shown, one cassette location has associated with it only a cam 118, one cassette location has only a cam 119, one cassette location has both a cam 118 and a cam 119, and one cassette location has neither of the cams associated with it. Thus, either both, one or none of the limit switches 120 and 121 are depressed depending on which of the four cassette locations within the cartridge 70 is approaching alignment over the record/listen position.

The particular state of the two switches 120 and 121 provides a binary code indicating which of the cassette locations in the cartridge 70 is being approached. Thus, by means of control circuitry and display circuitry to be described hereinafter, the operator of the apparatus can choose which cassette location is to be lowered into the record/listen position by observing which location is approaching the record/listen position and operating a control to either cause the cassette in the approaching position to be lowered or cause the cartridge to continue rotating until a desired cassette location is reached. Also, the cams 118 and 119 cooperate with the limit switches 120 and 121 after the cartridge 70 has stopped rotating to provide a binary code which indicates which cassette location in the cartridge 70 has been lowered into the record/listen position.

The cams 118 and 119 and limit switches 120 and 121 are utilized only in the electrical storage and display embodiments of the invention described below. They have been described at this point in the specification along with the remainder of the cartridge 70 for clarity.

For dictation recording, a conventional dictate control (not shown) is connected to the tape transport mechanism in a conventional manner. The dictate control (not shown) operates the transducer head assembly 66 to move the record/listen head 68 and the pinch roller 67 into and out of engagement with a cassette in the record/listen position. The dictate control also rotates the spindles 63 and the pinch roller 67 and the head 68 to provide various modes known to those skilled in the art in order to advance and rewind the tape of a tape cassette, to record dictated messages on the tape, and to listen to material previously recorded. It is also contemplated that the dictate control will include means for causing the record/listen head 68 to record indexing signals on the tape 68 in a manner similar to that disclosed in U.S. Pat. No. 4,024,354, and to display indexing information for an operator in a manner as disclosed in a commonly assigned copending application entitled "Dictation Display Device", Ser. No. 027,990, filed Apr. 9, 1979.

For transcription of dictated material, a conventional transcribe control (not shown) is connected to the tape transport mechanism in a conventional manner. The transcribe control operates the transducer assembly 66 and spindles 63 in a manner similar to that provided by the dictate control to allow a transcriptionist to advance and rewind the tape within a cassette in the record/listen position, and to provide an audible output in a listen mode so that the dictation recorded on the tape can be transcribed. It will be understood that a listen head can be substituted for the record/listen head 68 if a unit is to be used only for transcription. Means for displaying indexing information useful to the transcriptionist as shown in said application Ser. No. 027,990 can be connected to an apparatus embodying the invention.

A control circuit 152 as shown in FIG. 16 is provided to operate the cassette changer apparatus 10 to rotate the cartridge 70 to place a desired cassette in the record/listen position. A shift initiator switch S1 (shown diagrammatically in FIG. 16) is mounted on the dictate or transcribe control (not shown). Switch S1 is connected through an OR gate 155 to operate the motor 45. The switch S2 mounted beside the cam 23 is also connected to the motor 45 through OR gate 155. Switch S1 is also connected to the input of latch 158. Upon concurrence of a signal from switch S5 and the lack of a signal from switch S1, a zero is maintained as the output of latch 158. If the dictator keeps switch S1 closed indicating a desire to skip a position, a one will be placed on the output of latch 158 the next time it is stroked by an output from S5 thus providing a signal to energize the solenoid 147 to rotate the latch 140 beneath the raised frame 17. Thus the output of latch 158 can only change when frame 17 has been raised above the latch 140 so that the latch cannot be pivoted above or into the side of the frame 17.

In operation of the embodiment of the invention thus far described, a cartridge 70 holding cassettes 80 retained in cassette locations by the guides 74, is placed over the vertical shaft 20 into position on the cartridge support member 35, and properly located by fitting the keyway 79 over the cartridge locator key 38. Since, when the system is at rest, the frame 17 is fully lowered and one of the stops 37 is contacting the pivot link 53, placement of the cartridge 70 in such a manner will also position one of the tape cassettes 80 in the record/listen position on the transport deck 62, with the reels within openings of the tape cassette 80 engaging the spindles 63. Furthermore, the positive locator keyway 81 associated with the cassette in the recording position will slidably engage the positive locator key 64 and thereby guide the cartridge 70 into a precise location with respect to the transport deck 62.

A dictating person can now utilize the dictate control to record units of dictation on the tape cassette 80 in the record/listen position by bringing the transducer head assembly 66 into position against the cassette 80. As is traditionally the case, the dictate control is then used to move the tape by driving it between the pinch roller 67 and the capstan 65, and by energizing the record head 68 to record a dictated message on the tape within the tape cassette 80. Commonly, the dictate control also provides capabilities for listening to previously recorded messages, for recording instructions regarding recorded messages, and for recording various indexing signals, as described, for example, in U.S. Pat. No. 4,007,491. If the operator is a transcribing person, typical transcribe functions are carried out, and the following operational description applies to both dictation and transcription uses of the present invention.

As the operator operates the dictate or transcribe control and tape within the cassette 80 is thereby moved past the record/listen head 68, the pinion gear 104 is driven by the worm gear 94 which is driven by the spindle 63 via belts 98 and 102. The pinion gear 104 thus moves along the worm gear 94, and carries the pointer 108 along the scale 114 a distance corresponding to the number of rotations of the spindle 63. Those skilled in the art will understand, therefore, that the position of the pointer 108, if reset set to the "zero" position along the scale 114 prior to operation of the dictate control, will display the amount of the tape that has passed by the record head 68. The pointer 108 will move both forward along the scale 114 when the dictate control is operated to record or listen to dictation on the tape within a cassette, and in reverse along the scale 114 when the dictate control is operated to rewind the tape. The pointer 108 thus displays and stores the current status of net tape motion within the cassette.

When the full length of the tape within the cassette 80 has been utilized, or whenever the operator desires to interrupt dictation or transcription on a tape cassette in the record/listen position and switch to another of the cassettes 80 within the cartridge 70, he or she need only depress shift initiator switch S1 mounted on the dictate control. The depression of switch S1 momentarily connects the power supply to the DC motor 45, initiating rotation of the cam drive pulley 40 and the cam 23. The cam trip 27, which depresses the lower cam switch S2 when the system is at rest, is rotated away from switch S2, thereby releasing it. Since the switch S2 is closed when released, the DC motor 45 remains energized, and the cam 23 continues to rotate in a clockwise direction. The cam follower 28 follows the cam surface 24 and immediately leaves the indentation in the cam surface 24 which has placed the cam and the frame 17 in its lowered position when at rest. Thus, the cam begins to rise and causes the frame 17 to pivot about the pivot rod 15, and to lift the cartridge 70 above the recording position clear of the spindles 63, the capstan 65 and the key 64.

When the cartridge 70 is lifted, the pinion gear 104 is disengaged from the worm gear 94. Therefore the information about the amount of tape utilized on the cassette mounted in the cartridge at the particular cassette location being removed from the record/listen position is stored by gear 104 and pointer 108 associated with said cassette location since such gear and pointer do not move unless the pinion gear again engages the worm gear 94 or the pointer is manually reset.

During the initial rotation of the cam 23, while the cam is lifting the cartridge 70 clear of the transport deck apparatus, the cartridge motion stop 37 biased against the pivot link 53 prevents rotation of the clutch-engaging member 34, the cartridge support member 35, and the cartridge 70. However, when the cam 23 has rotated approximately 180°, the cam trip 27 passes by and hits the trigger member 53b of the pivot link 53, thereby removing the pivot link 53 from the path of the stop 37. The cartridge 70 is thus allowed to rotate with the cam 23 since nothing prevents the clutch 32 from driving the clutch-engaging member 34.

Since the cam trip 27 rotates on past the pivot link 53 the spring 55 urges the brake member 53a of the pivot link 53 to immediately move back into position against the circumference of the clutch-engaging member 34. Thus, after a rotation of 90°, the next stop 37 engages the pivot link 53 and once again prevents rotational motion of the cartridge 70. At this point, however, the next successive tape cassette 80 mounted in the cartridge 70 has reached a location directly above the record/listen position. It will be noted also that the cam 23 is designed so that the rotational movement of the cartridge 70 has occurred entirely while the cam has held the frame 17 in the raised position. Immediately after the rotational movement of the cartridge 70 has been completed, the cam surface 24 begins to lower the frame 17 to its lowered position, lowering the cartridge 70 with the next adjacent cassette 80 now in the record/listen position on the transport deck 62. The vertical movement of the cartridge inserts the spindles 63 and capstan 65 into the proper openings in the cassette 80. As the cam 23 completes one full revolution, the cam trip 27 again depresses the lower cam switch S2, breaking the connection beteen the power supply and the DC motor 45 and causing the apparatus to again come to rest. The switch S4 is also closed and causes a signal to be sent to the control circuit 152 indicating that the frame 17 has been lowered to place the next succeeding cassette location in the cartridge 70 in the record/listen position.

If the cassette that has newly been placed in the record/listen position has been recorded upon previously, the associated pointer 108 will display the stored information as to how far the tape had been moved within the cassette. The lowering of the cartridge 70 has re-engaged the associated pinion gear 104 with the worm gear 94, so that the operation of the dictate control to advance or rewind the tape will move the pointer 108 accordingly to continue to accurately display the position of the tape.

The foregoing assumed that the operator desired to move to the next successive cassette location around the perimeter of the cartridge 70. If, however, the operator does not wish to utilize the next adjacent tape cassette 80, but wishes to gain access to one of the other cassettes 80 mounted in the cartridge 70, the operator can visually note the approach of the undesired cassette location and once again activate the shift initiator switch S1. By continuing to depress or by again depressing and holding switch S1, the solenoid 147 is energized to pivot the latch 140 under the frame 17 to prevent the frame 17 from being lowered by the cam 23 until the next occurrence of a stroke signal from switch 55 when switch S1 is released. Thus, the operator can visually note the approach of a desired cassette location and release the switch S1 which will clear latch 158 when S5 is closed thus allowing the selected cassette location to be lowered into the recording positin by the cam 23. It will be noted, however, that the latch 140 must not be extended under the frame 17 until after the frame 17 has been raised to a height above the latch 140. To prevent such an occurrence, energization of the solenoid 147 is permitted only when the switch S5 is closed which only occurs when the frame 17 has been lifted above the latch 140.

Thus, the operator may rotate the cartridge 70 automatically and repeatedly as desired, to gain access to any of the plurality of cassettes mounted in the cartridge 70 and to easily return to a cassette upon which the operator previously was working, without stopping at undesired cassette locations. Of course, the tape within any cassette to which the operator returns will be found in precisely the same position as it was when dictation or transcription on that cassette was interrupted, and the pointer 108 associated with such cassette will be found at the same location along the appropriate scale 114, indicating the position of the tape.

FIRST ELECTRICAL STORAGE AND DISPLAY

Figure 13:
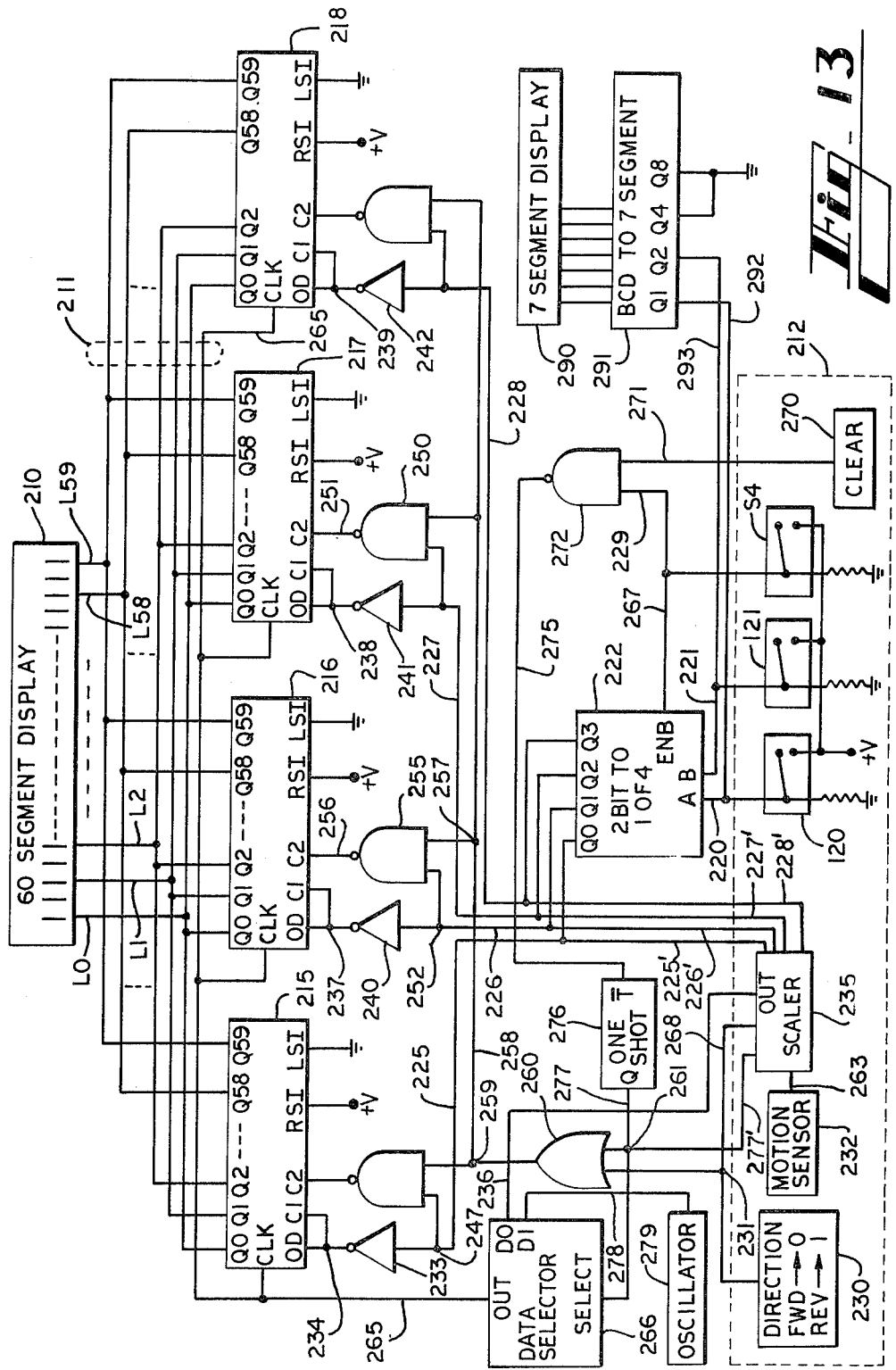
FIG. 13 is a circuit diagram for a circuit for providing electrical storage and display of parameters of dictation in a second embodiment of the present invention including such circuit and a cassette changer apparatus such as shown in FIGS. 1-12.

FIGS. 13, 14, 15A and 15B show second and third embodiments of the present invention including alternate means for electrical storage and display which may be used instead of the mechanical storage and display described hereinabove in connection with the first embodiment of the invention. The structure of the cassette changer 10 and the control circuit 152 are identical to those described above when the embodiment of the invention includes the electrical storage and display shown in FIGS. 13 and 14 or the one shown in FIGS. 15A and 15B. However, the worm gear 94, spur gear 104, pointer 108 and associated apparatus are unnecessary. The storage and display means of FIG. 13 is the simpler of the two and will be described first.

The display element of the storage and display device shown in FIG. 13 comprises sixty selectively actuable indicator segments shown as display 210. As may be seen from FIG. 13 display 210 comprises indicator segments which are arranged linearly. Each of the selectively actuatable indicator segments will be actuated by a logical one condition on one of the lines L0-L59. It will be understood from examination of FIG. 13 that line L0 controls the leftmost segment of display 210. Line L1 controls the segment second from the left and so forth until line L59 controls the far right segment of display 210. Each of the lines L10-L59 controlling the segments of display 210 are tied to an appropriate line on display bus 211. The lines of display bus 211 are tied to the outputs of shift registers 215, 216, 217, and 218. Each of the shift registers will store the electrical signals representing the appropriate display for each of the cassettes 80 positioned in cartridge 70 shown in FIG. 2.

The circuitry shown in block 212 includes the elements which interface with the mechanical dictation and transcription device described hereinabove. The remaining circuit elements shown in FIG. 13 are the timing and steering logic which respond to the inputs from block 212 to both store the signals representing a display associated with each particular cassette and to cause the proper segments of display 210 to light when a particular cassette is in the play or record position.

Display 210 provides a moving "bar" or "shutter" to indicate how much of the tape in a particular cassette has been wound past the record/listen head 68, and therefore what location along the tape is presently opposite the record/listen head 68. In the preferred embodiment the leftmost segment of display 210 represents the beginning of tape and the rightmost segment represents the end of tape. It will therefore be apparent that as tape is wound in a forward direction during a dictation or transcription operation the leftmost segment of display 210 will be actuated, and as tape continues to be wound, contiguous segments of the display will also be actuated thus forming a "shutter" which represents the present position of the tape.

The baasic storage units of the storage and display apparatus of FIG. 13 are shift registers 215-218, each of which is identical. These shift registers are sixty bits long, bidirectional, and have sixty tri-state parallel outputs Q0-Q59. Each shift register also includes a clock (CLK) input, a right shift input (RSI), and a left shift input (LSI). The mode of operation of each of the shift registers 215-218 is controlled by two inputs C1 and C2. The state of parallel outputs Q0-Q59 is controlled by an output disable (OD) input.

Shift registers 215-218 may be embodied in a large scale integrated circuit or by a combination of cascaded medium scale integrated circuits. More particularly, shift registers 215-218 may be embodied by cascading eight shift registers similar to the type DM 7546 tri-state eight bit universal I/O shift registers currently manufactured by National Semiconductor Corporation. Eight of these shift registers may be cascaded in a well known manner and the designations for the inputs shown on FIG. 13 correspond to those shown by the manufacturer.

As discussed hereinabove, switches 120 and 121 which are responsive to cams 118 and 119 which indicate which particular cassette is approaching or is in the recording position. It will therefore be appreciated that the states of switches 120 and 121 will give a direct readout of a binary number between 00 and 11. The outputs for switches 120 and 121 appear on lines 220 and 221, respectively. Lines 220 and 221 are provided as the inputs to a two bit to one of four decoder 222. As will be appreciated by those skilled in the art, when the enable (ENB) input from line 267 is high, decoder 222 will have one and only one of its outputs Q0-Q3 in a logical one state depending on the binary number which appears at inputs A and B. Thus, when lines 220 and 221 are equal to a logical zero, indicating that switches 120 and 121 are both open, output Q0 of decoder 222 will be a logical one. Similarly when lines 220 and 221 are both equal to a logical one, the Q3 output of decoder 222 will be a logical one and the remaining outputs of the decoder will be logical zeros. The outputs Q0-Q3 of decoder 222 appear on lines 225-228 respectively. Switch S4 which is also shown in FIG. 4 is closed and provides a logical one on lines 229 and 267 when any cassette is in the record/listen position.

Switches 120 and 121 also control a position indicator 290 which is shown as a conventional 7 segment numerical display in FIG. 13. The outputs of switches 120 and 121 are provided on lines 292 and 293, respectively, to BCD to 7 segment decoder 291 which drives 7 segment display 290. Decoder 291 is not responsive to switch S4. The position indicator 290 is thus responsive to the switches 120 and 121 to provide a visual indication of which cassette location is approaching the record/listen position. The operator is therefore able to depress switch S1 in order to skip any approaching cassette location by causing continued rotation of the cartridge 70 until a desired cassette location is reached, as was fully described above in connection with another embodiment of the invention.

Direction sensor 230 is responsive to the direction in which tape is being wound and provides a logical zero output to point 231 when tape is moved in a forward direction and a logical one when tape is moved in a reverse direction. Motion sensor 232 provides pulses indicative of tape motion in a conventional manner such as that described in U.S. Pat. No. 3,820,101. These pulses are provided to scaler 235 which may be embodied by an up/down counter so that a pulse is provided along line 236 in response to a number of pulses from motion sensor 232 representing approximately thirty seconds of tape moved at the normal playing speed. The selection of scaler 235 to provide an output on line 236 for each thirty seconds worth of tape is dictated by the selection of display 210 having sixty segments. Therefore for a cassette having thirty minutes of recording time, sixty pulses will be provided by scaler 235 completely filling (as described hereinbelow) display 210. Note that scaler 235 has an input from direction sensor 230 which appears on line 268 and controls the direction of count. A preferred form of scaler 235 is shown in FIG. 14 and described hereinbelow.

As noted above each of shift registers 215-218 have tri-state parallel outputs. These outputs are in their high impedance state when input OD is supplied with a logical one and are in their low impedance state and thus effectively connected to bus 211 when input OD is provided with a logical zero. For shift registers 215-218 the OD input is supplied by points 234, 237-239, respectively. These points carry the outputs of inverters 233, 240-242, respectively. The inputs to inverters 233, 240-242 are provided by lines 225-228, respectively, and therefore the OD inputs for shift registers 215-218 will simply be the logical inverse of the output from decoder 222 associated with each shift register. It will therefore be appreciated that when a particular shift register 215-218 has been selected by decoder 222, a logical one will be provided on the appropriate output of decoder 222 and inverted by one of the inverters 233, 240-242 providing a logical zero to the OD output of the particular shift register. This will connect the parallel outputs Q0-Q59 of that particular shift register to bus 211. The remaining unselected shift registers will have a logical zero on the output of decoder 222 associated with each shift register and thus a logical one will be provided to the OD inputs of the remaining shift registers forcing their outputs to their high impedance state and effectively removing them from bus 211.

Recall that switch S4 is open whenever cartridge 70 shown in FIG. 4 has been raised in order to change the cassette which is in recording position. Therefore, whenever cartridge 70 is rotating, switch S4 will be open providing a logical zero on line 267. The logical zero on line 267 causes all outputs of decoder 222 to be zero which places the outputs of shift registers 215-218 in their high impedance state. This will blank all of indicator segments 210 when cartridge 70 is being rotated.

It may thus be seen that the output of decoder 222 will select one and only one of shift registers 215-218 to be connected to bus 211 and the remaining three shift registers will have their parallel outputs Q0-Q59 in a high impedance state. Therefore, whenever a cassette is in the recording position one and only one of the shift registers 215-218 will be connected through bus 211 to lines L0-L59 and thus to display 210. Whenever cartridge 70 is rotating indicating (through opening of S4) that a change of the selected cassette is in progress, the outputs of decoder 222 will be logical zero. Therefore, all four shift registers 215-218 will be disconnected from bus 211 when a cassette change operation is in progress.

The control inputs C1 and C2 of each shift register 215-218 operate as follows. Whenever both inputs C1 and C2 are high, operation of the shift register is inhibited without regard to the state of the clock input. When C1 is low and C2 is high the shift register will shift right in response to positive going transitions appearing at the clock input. When both C1 and C2 are low the register will shift left in response to positive going transitions of the clock input. The remaining combination (C1 high and C2 low) will parallel load the shift register with the contents of bus 211. It will be apparent, that in the particular embodiment of the invention disclosed herein, such a condition must be avoided.

The function of the storage and display shown in FIG. 13 may best be described by way of example. Note, that there is symmetry between the gating on the C1 and C2 inputs for all of shift registers 215-218. Therefore, the description of operation of one particular shift register will suffice to explain how each of them operate.

Assume that the cassette associated with shift register 216 (and thus the Q1 output of decoder 222) is in record position and a fresh cassette is in place. Outputs Q0, Q2 and Q3 of decoder 222 will all be in their logical zero state and, as explained hereinbefore, will have their parallel outputs in a high impedance state. Since shift register 217 is one of the shift registers 215, 217, and 218 which have not been selected because of the position of the cartridge, the Q2 output of decoder 222 appearing on line 227 will be a logical zero. This logical zero is inverted by inverter 241 thus supplying a logical one to point 238. This logical one drives the OD input high, disconnecting the outputs of register 217 from bus 211, and also forces the C1 input of register 217 to its logical one state. The logical zero on line 227 is also provided as one input to NAND gate 250. The logical zero on one input of NAND gate 250 causes line 251 to be in its logical one state and thus control input C2 of register 217 is also a logical one. It may therefore be appreciated that whenever a logical one appears on input C1, it necessarily follows that a logical zero appears at point 227 as one input to NAND gate 250. It further follows that whenever input C1 is a logical one, input C2 will also be a logical one and thus, the prohibited state (C1=1, C2=0) of the control inputs which would attempt to parallel load the contents of bus 211 into shift register 217 cannot occur. Furthermore, whenever shift register 217 has not been selected as indicated by a logical zero on line 227, inputs OD, C1, and C2 will all be logical ones and thus shift register 217 will be in an inhibit mode and unresponsive to the clock input of the shift register. Therefore, whenever any of the shift registers 215-218 are not selected, both control inputs and the output disable input are all in their logical one states, and the shift registers will not be responsive to their clock inputs nor will they be connected to bus 211.

Continuing with the example in which it is assumed that shift register 216 has been selected note that the logical one which appears on line 226 also appears at point 252 as an input to both inverter 240 and NAND gate 255. The output of NAND gate 255 appears on line 256 and controls the C2 input of shift register 216. The logical one at point 252 is inverted by inverter 240 to a logical zero which is supplied through point 237 to both the OD and C1 inputs of shift register 216. The logical zero on the OD inputs connects the parallel outputs of shift register 216 to bus 211 and thus display 210 will be indicative of the contents of shift register 216.

Assume, in the example, that shift register 216 begins in a state containing all zeros. The logical zero at point 237 is also supplied to control input C1 and, as explained in the function of the control inputs above, the shift register will respond by shifting right or left in accordance with the logical state at the C2 input whenever a positive transition appears on the clock. Since a logical one is provided to point 252 as an input to NAND gate 255, the output of NAND gate 255 will be the logical inverse of a logic state appearing at point 257. Point 257 is connected via line 258 to point 259 which is the output of OR gate 260. As will be explained hereinbelow, during normal operation of the present invention point 261 will be in its logical zero state and thus, through the action of OR gate 260 point 259 will be at the same logical state as point 231. Therefore, point 257 which is an input to NAND gate 255 will be in the same logical state as point 231 which is the output of direction sensor 230.

As dictation or transcription proceeds, winding tape in the forward direction, a logical zero appears at point 231 and thus at point 257. This logical zero is inverted by NAND gate 255 (recall that the other input is a logical one) thus providing a logical one to control input C2. Therefore, C1 is equal to a logical zero and C2 is equal to a logical one and the contents of register 216 will shift right in response to a positive transition on its clock input. Note that the clock inputs to all shift registers are tied to line 265. Line 265 is the output of two bit data selector 266. Note that point 261 also provides the select input for data selector 266 since it was assumed that point 261 is in its logical zero state, the data at the D0 input of the data selector 266 will appear on line 265. Since D0 of data selector 266 is connected to line 236 the motion pulses which are the output of scaler 235 will be provided along 236, through data selector 266 to line 265 as the clock input to all shift registers 215–218.

Shift registers 215, 217 and 218 are all inhibited and therefore shift register 216 will be the only one responsive to the clock signals appearing on line 265. Since a pulse appears on line 265 for approximately every thirty seconds of tape moved forward at a normal speed, each time thirty seconds of tape is moved, shift register 216 will be clocked. The first pulse to appear on line 265 will cause the contents of shift register 216 to shift right. As may be seen from FIG. 13, the right shift input (RSI) of register 216 is tied to a logical one condition and thus, a logical one will be shifted into the leftmost position of shift register 216. This will cause a logical one to appear at the Q0 output of register 216 and, through the appropriate line of bus 211 this logical one will also appear at input L0 to display 210. The logical one on line L0 will cause the leftmost segment of display 210 to be actuated.

As tape continues to advance in the forward direction, scaler 235 will provide pulses which appear on line 265 and continue to clock shift register 216. Each time shift register 216 is clocked (in the state described) the register will shift right and a logical one will be shifted into the leftmost position. Thus, the shutter which appears in display 210 will proceed to the right and thus the fraction of display 210 which is lighted, represents the fraction of tape which has been moved from the beginning position.

If the operator begins to rewind tape, the output of direction sensor 230 changes to provide a logical one at point 231. This is provided to point 259, along line 258 to point 257. Therefore, both inputs to NAND gate 255 will be one and a logical zero will appear on line 256 at input C2. In this state, both inputs C1 and C2 of shift register 16 will be in their logical zero states and the contents of the register will shift left in response to clock signals on line 265. As shift register 216 shifts left, the shutter which is present in display 210 will retreat toward the lefthand end of the display.

From the foregoing it will be apparent that as tape in a particular cassette which corresponds to a particular one of shift registers 215–218 is advanced in a forward direction, the shift register will begin to fill with logical ones beginning at the lefthand end as clock pulses are provided as the outputs of scaler 235. Similarly, when tape moves in the other direction the contents of the shift register will shift left. Note that the left shift input for each of the shift registers 215–218 is grounded and thus, logical zeros will be shifted into the righthand end of the register as it shifts left.

Next assume that the operator activates switch S1 to remove the cassette associated with shift register 216 from the record/listen position and replace the cassette associated with register 217 into the record/listen position. As cartridge 70 rises, switch S4 opens. As described above, this state places logical ones on the OD, C1 and C2 inputs of all shift registers 215–216 while the change is taking place. Further assume that when the change is initiated the particular cassette associated with shift register 216 was wound five minutes from the beginning of tape and thus the ten lefthand locations of shift register 216 contain logical ones. When all the OD, C1 and C2 inputs went to a logical one, shift register 216 was disabled, and therefore the ten logical ones in the leftmost positions of shift register 216 remain undisturbed.

From the foregoing it will be apparent that shift register 216 will remain in its inhibited state unresponsive to clock signals on line 265 until the particular cassette associated with register 216 is again in a record/listen position. Therefore, while other cassettes are being used in the present invention, the contents of shift register 215 will contain data signals which are representative of the amount of tape which has been wound from the beginning of tape in the particular cassette associated with this register. It will therefore be appreciated that registers 215–218 provide a storage means for storing signals corresponding to an appropriate display to be generated in display 210 for each particular cassette.

When the cassette associated with register 217 is in the record/listen position switch 121 will be closed and switch 220 will remain open thus placing a logical one on line 227. All other shift registers will be inhibited. Shift register 217 will respond to direction sensor 230 and the clock signals on line 265 in the same manner described hereinabove for shift register 216.

Note that whatever the previous contents of shift register 217 may have been when the cassette associated therewith last left the record/listen position, such contents will remain undisturbed when this cassette is again selected from the record/listen position. As soon as the logical one appears at point 227, a logical zero appears at point 238 due to the action of inverter 241 enabling the parallel outputs of register 217 and connecting same to bus 211 and thus display 210. Therefore, when the particular cassette associated with shift register 217 is in record/listen position, the display associated therewith will immediately appear in sixty segment display 210.

As will be known to those skilled in the art, it is common that cassettes are removed from a dictating machine without being rewound, and thus a means of clearing a particular shift register of the logical ones representative of the position of the tape upon removal should be provided. In the embodiment shown in FIG. 13, the particular shift registers do not have a master reset or clear input. Of course, embodiments are possible in which a clear input could be provided for each shift register and the circuitry described below would be unnecessary. However, in the particular disclosed embodiment a separate means for clearing the shift registers is shown. Clear switch 270 is shown in FIG. 13. As will be appreciated by those skilled in the art, this may be a manually operable switch, or a switch which is responsive to the removal of a cassette. In the embodiment shown, in order to clear a shift register, the particular cassette associated with that shift register must be in the record/listen position.

Since the particular cassette must be in the record/listen position, it follows that switch S4 will be closed providing a logical one on line 229. The operation of clear switch 70 provides a logical one on line 271 and thus, both inputs to NAND gate 272 will be logical ones upon operation of clear switch 270.

Assume that the particular cassette associated with shift register 216 has been selected and that it is register 216 which the operator desires the clear. With this cassette selected, the Q1 output of decoder 222 will provide a logical one along line 226 to point 252. The logical one at point 252 causes a zero to appear at the C1 input through the action of inverter 240. When clear button 270 is depressed and both inputs to NAND gate 272 go high, a logical zero appears on line 275 which is the input to negative edge triggered one shot 276. The triggering of one shot 276 causes a logical one to appear on line 277, the noninverted output of the one shot. The logical one on line 277 is provided to point 261. Note, that it was assumed above that point 261 was normally in its logical zero state. As will be appreciated by those skilled in the art, when either of the inputs to NAND gate 272 is zero one shot 276 will time out and line 277 will normally be in its logical zero state.

When line 277 goes to its logical one state this logical one forces the output of OR gate 260 to go high. Recall that the output of OR gate 260 is provided through point 259, line 258 to point 257 as an input to NAND gate 255. Therefore both inputs of NAND gate 255 are logical one causing the C2 input of shift register 216 to become zero. Therefore, both C1 and C2 are zero and the register will be conditioned to shift left. Note, that OR gate 260 will provide the logic state at point 231 to point 259 whenever point 261 is zero. When point 261 becomes one upon the firing of one shot 276 point 259 is forced to a logical one condition and thus, the selected shift register will "think" that direction sensor 230 is indicating reverse motion of the tape.

The firing of one shot 276 also changes the state of the select input of data selector 266 and thus the D1 input from line 278 will be provided as the output along line 265. Line 278 carries the output of an oscillator 279. The output frequency of oscillator 279 is sufficiently high that more than sixty positive transitions will occur during the period of one shot 276. It will therefore be appreciated that the firing of one shot 276 which is caused by the closure of clear switch 270 when switch S4 is closed has the following consequences. It causes the selected shift register to be conditioned to shift left; it provides a high frequency clock signal from oscillator 279 on line 265 and the particular selected shift register will rapidly begin shifting left. Since the left shift input of all shift registers 215–218 are connected to logical zero, the selected register will quickly be cleared to all zeros.

When one shot 276 times out the storage and display shown in FIG. 13 returns to its normal operating state.

A preferred form of scaler 235 is shown in FIG. 14. The scaler comprises four up/down counters 280–283, each of which is associated with one of shift registers 215–218. Counters 280–283 are all clocked from the signal on line 263' from one shot 264 which is responsive to motion sensor 232 shown in FIG. 13. The counters have a NOT UP/DOWN input which is controlled by line 268 from direction sensor 230 (FIG. 13).

Each counter is enabled by one of the lines 225'–228' which carry the outputs of decoder 222 (FIG. 13). Therefore when a particular shift register is selected, the corresponding counter 280–283 will be enabled.

This allows each counter to maintain an accurate count for the cassette with which it is associated.

When one of shift registers 215–218 is to be cleared, the corresponding counter 280–283 will be cleared by the action of one of NAND gates 285–288. Each of NAND gates 285–288 has the signal on line 277' from one shot 276 at one input. The other input for each gate is the output line from decoder 222 (225'–228') associated with a particular counter. Thus when a particular counter is selected and the output of one shot 276 goes high (indicating a clear operation) the output of the associated NAND gate 285–288 will go low clearing the counter.

The ripple clock (RC) output of each counter goes high when the counter either overflows or underflows and a clock pulse is present. Therefore the RC output of a counter will only be high during the presence of a pulse from one shot 264 and no spurious pulses will appear on line 236 when a particular counter is first enabled.

SECOND ELECTRICAL STORAGE AND DISPLAY

Figure 15B:
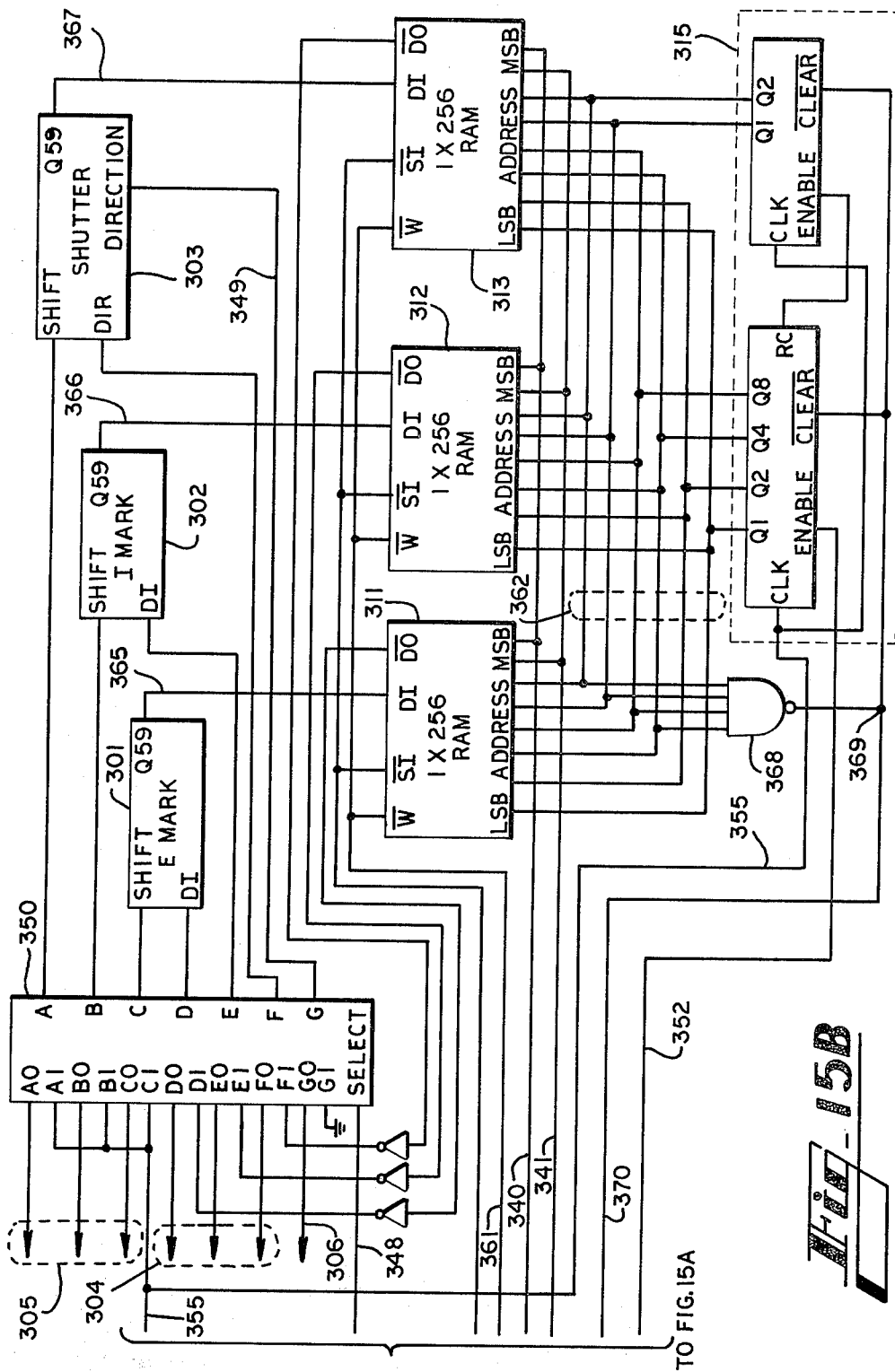

FIGS. 15A and 15B show a third embodiment of the present invention including a more complex embodiment of the electrical storage and display means. The memory storage and display control of FIG. 15B is the preferred embodiment of apparatus to be used with a transcription display of the type disclosed in the above-mentioned co-pending application Ser. No. 027,996 filed Apr. 9, 1979 entitled "DICTATION DISPLAY DEVICE". Said co-pending application Ser. No. 027,990 is hereby incorporated herein by reference.

In said co-pending application Ser. No. 027,990 the transcription display comprises sixty selectively actuable indicator segments which are controlled by the contents of three shift registers. Shift registers 301, 302 and 303 shown in FIG. 15B correspond to the shift registers in the display of Application Ser. No. 027,990. The parallel outputs of shift registers 301–303 are not shown in FIG. 15B.

As is set forth in said co-pending application the contents of shift registers 301–303 are inputed through normal input lines shown as 304 in FIG. 15B. Lines 304 includes the normal data in right (DIR) input for shift register 303 which is the input when data is being shifted to the right. The data in left input is not shown. The clocks for shift registers 301–303 used during their normal operations appear on lines 305 shown in FIG. 15B. Line 306 is the normal direction input for bidirectional shutter shift register 303. As will be explained hereinbelow, when lines 304, 305, and 306 are connected to shift registers 301–303, operation of the display will proceed as disclosed in co-pending application Ser. No. 027,990.

It will therefore be appreciated that an E mark detector resopnsive to the detection of E mark signals recorded on the tape in the transcribe unit is connected to the DO line of lines 304. It will be understood that E mark detector 28 responds to the presence of recorded E marks when the tape is running in a fast wind mode. Similarly, an I mark detector which responds to the presence of I mark signals recorded on the tape in the transcription unit during fast winding is connected to the EO line of line 304. Such detectors may be implemented in a known manner by using two filters which respond to the frequencies of the respective signals over the range of possible fast wind speeds. Furthermore, such a detector for the fast wind mode is disclosed in U.S. Pat. No. 3,882,545 assigned to the assignee of the present invention.

It will be understood that the E mark detector provides a logical one output upon detection of an E mark recorded on the tape as the recorded E mark signal passes over the playback head of the transcription unit. Similarly, the I mark detector will provide a logical one output upon detection of a signal corresponding to a recorded I mark.

Similarly, lines 305 are connected through appropriate steering logic to the output of a motion sensor which provides output pulses when the tape is in motion. Such motion sensors are constructed by forming a mechanical linkage between either the supply or take-up spindles of the tape transport and providing a transducer such as a light chopper or a switch to provide pulses when the tape is in motion. An example of such a motion sensor is disclosed in U.S. Pat. No. 3,820,101 assigned to the same assignee as the present invention. The motion sensor driving lines 305 is of the same type as motion sensor 232 shown in FIG. 3.

The display storage and control device shown in FIGS. 15A and 15B is controlled by a state counter 310 and an address counter 315. The storage elements comprise three 1×256 random access memories (RAM) 311, 312, and 313. The display storage and control device shown in FIGS. 15A and 15B is operated on a two phase clock 316, the output of which is represented in FIG. 15C.

It is to be understood that at any time during a transcription operation, the contents of shift registers 301–303 provide information to the transcriptionist through the sixty segment display (not shown) as to the locations of end of dictation segments marks (E marks), the locations of instructions on the tape (I marks) and an indication of how far the tape has been wound forward from the point of farthest rewind (shutter). As will be appreciated from the following description of the third embodiment and the disclosure of Application Ser. No. 027,990, the shutter of the third embodiment will provide a display for use during a dictation operation whose output is identical to that described above for the second embodiment. It will therefore be understood that if dictation recording or transcription is proceeding from a particular cassette 80 in cartridge 70 (FIG. 2) and the operator of the unit wishes to begin transcribing from another cassette, it will be necessary to store the contents of shift registers 301–303 for later recall and to read into the display the previous contents of the shift registers associated with the next cassette from which transcription is to be taken. Therefore, it is necessary to store the current contents of shift registers 301–303 when a change of cassette operation begins, and to write the contents for the cassette which next comes into record/listen position upon the arrival of the cartridge at the appropriate position. This is the function of the apparatus of FIGS. 15A and 15B. It will be understood that shift registers 301–303 comprise a display memory, the contents of which are provided to drive a display during operation of the system.

As described hereinbefore, switches 120 and 121 are operated by cams 118 and 119 which give a direct binary readout corresponding to the particular cassette 80 which is in record/listen position. Recall furthermore that S1 is the switch which is depressed to initiate a change operation and that the closing of switch S4 indicates when cartridge 70 has been lowered thus lowering a particular one of cassettes 80 into record/listen position. Switches S1, S4, 120 and 121 are represented by blocks on FIG. 15A. It will be understood that line 392 is the output of S1 which corresponds to switch S1 shown in FIG. 16.

As may be seen in FIG. 15A, switches 120 and 121 also control cartridge position indicator 390 which is embodied by a conventional 7 segment numerical display.

Indicator 390 is driven by BCD to 7 segment decoder/driver 391 which has its two most significant bits tied to ground. Therefore indicator 390 will provide a single digit output from 0 to 3 depending on the states of switches 120 and 121. As cartridge 70 rotates, cams 118 and 119 will engage switches 120 and 121 providing a binary output on lines indicating which of cassettes 80 is approaching the record/listen position. Therefore indicator 390 will provide a numerical indication of the cassette approaching the record/listen position. If the operator wishes to skip that cassette he may depress S1 which activates solenoid 147 as described hereinabove to skip the approaching cassette.

The operation of the memory storage and control apparatus of FIGS. 15A and 15B will now be described. State counter 310 is a two bit binary counter having a least significant bit which appears at point 317 and a most significant bit which appears at point 318. Thus counter 310 has four states: 00, 01, 10, and 11.

The reading and writing cycle of the display storage and control device is initiated upon operation of switch S1. Switch S1 is connected to a positive transition detector 319 which comprises a pair of D type flip-flops 320 and 321 and NOR gate 322. As will be appreciated by those skilled in the art, positive transition detector 319 provides a logical one pulse on line 325 equal in length to one period of the clock signal appearing on line 326 when a positive going transition occurs at point 327. Transition detector 319 is insensitive to negative going transitions at point 327. Detector 319 includes an enable line 397 which must be at a logical zero for the detector to operate. Therefore it may be seen that positive transition detector 319 will only be enabled during the 00 state of counter 310 due to the action of OR gate 395. Positive transition detector 328 which is connected to switch S4 will be understood to be identical to positive transition detector 319 and will provide a pulse on line 329 in response to a positive transition from switch S4. The negated enable line 398 of detector 328 is tied to ground.

Lines 325 and 329 are inputs to NOR gate 330 which provides a logical zero output pulse at point 331 whenever a logical one pulse appears on either line 325 or 329. Therefore, operation of switch S1 will cause a negative pulse to appear at point 331 when a change cycle is initiated. The opening of switch S4 upon initiation of the change cycle will not affect the normally zero output of line 329, but when cartridge 70 sets a new cassette into the record playback position, a positive transition will be supplied by switch S4 providing a negative pulse at point 331.

Since the operation of switch S1 to initiate a change cycle provides a negative going pulse at point 331, a pulse is provided along line 332 as one input to NAND gate 335, the output of which controls the enable (ENB) input of state counter 310. The appearance of a logical zero on line 332 provides a logical one to the enable input of state counter 310. Note that positive transition detectors 319 and 328 are clocked on the φ1 clock phase while state counter 310 is clocked on the φ2 phase. Reference to FIG. 15C will render it apparent that the negative going pulse on line 332 which is the width of one φ1 clock cycle will be present and stable prior to the positive going transition of the φ2 clock phase which will cause state counter 310 to count from 00 to 01 in response to the logical one from NAND gate 335. Since the negative going pulse from line 332 is only one φ1 clock cycle long, this pulse will disappear before the second positive edge from the φ2 clock phase and thus state counter 310 will only count once in response to operation of switch S1.

State 01 is the state in which the information in shift registers 301–303 corresponding to the display associated with the particular cassette 80 about to leave the record/listen position is written into memories 311–313.

When switch S1 is depressed indicating beginning of a change operation, the logical zero pulse which appears at point 331 is inverted by inverter 336 to provide a logical one pulse on line 337. The logical one pulse is connected to the enable (ENB) input of two bit latch 338. The positive going transition which appears on line 337 "opens" latch 338 to the inputs D1 and D2 which carry the output of switches 120 and 121. The falling edge of the positive pulse on line 337 latches the logical conditions from switches 120 and 121 on output lines 340 and 341. Therefore, when switch S1 is depressed to begin a change cycle, the binary readout from switches 120 and 121 indicating the particular cassette 80 about to leave the record/listen position is latched onto lines 340 and 341.

As may be seen from FIG. 15B, lines 340 and 341 are connected to the two most significant bits of the address inputs of RAMS 311–313. Therefore, upon initiation of a change cycle the binary number associated with the cassette about to be left is latched onto the two most significant address bits of RAMS 311–313 and thus selects one-fourth of each RAM for storage. Since there are four possible states for switches 120 and 121, the latching of the particular output state on lines 340 and 341 will select one of four possible blocks of memory that is associated with a particular cassette associated with a current state of switches 120 and 121.

Since state counter 310 is now in its 01 state a logical one appears at point 317 which is inverted by inverter 342 and supplied as one input to NOR gate 345. The logical zero on point 318 supplies the other input to NOR gate 345 and therefore, in the 01 state of counter 310 both inputs to NOR gate 345 will be zero and a logical one appears on line 346 which provides the J input to flip-flop 347. It will therefore be appreciated that NOR gate 345 detects the 01 state of counter 310. Since state counter 310 makes its transition from 00 to 01 on the positive edge of the $\phi 2$ clock phase, it may be seen that the J input will be stable when the negative going edge of the $\phi 1$ phase clocks flip-flop 347 (see FIG. 15C) since flip-flop 347 is negative edge triggered.

As will become apparent from the description to follow, flip-flop 347 will set upon the first negative going edge of the $\phi 1$ clock phase to occur after state counter 310 has entered its 01 state and will not clear until the cycle is complete. Therefore the state of flip-flop 347 indicates whether the entire apparatus is in a read/write cycle.

The setting of flip-flop 347 provides a logical one on line 348 which controls the SELECT input of data selector 350. Data selector 350 has seven one of two data selectors controlled by the SELECT input responsive to line 348. As will be appreciated by those skilled in the art, data selector 350 may be embodied by two commonly available quad two bit data selectors. As will be further understood by those skilled in the art, each output will carry the data present on one line of a pair of corresponding input lines depending on the state of the select input. For example, output A of data selector 350 will carry the logic state from input A0 when line 348 is equal to a logical zero and output A will carry the logic state from input A1 when line 348 is a logical one. Similarly, output B will carry the logic state present at either input B0 or B1 depending on the state of line 348.

Therefore, since flip-flop 347 was in its Q=0 state prior to state counter 310 entering its 01 state, the select input would have been held to logical zero, and the outputs of data selector 350 would have carried the logic states on inputs A0, B0–G0. Note that A0, B0, and C0, carry the normal clock inputs 305 to shift registers 301–303. As may be seen from FIG. 15B the A, B and C outputs of data selector 350 are provided to the SHIFT inputs of shift registers 301–303 which clock the registers. Similarly inputs D0, E0, and F0 carry the normal data in inputs 304 for shift registers 301–303. Input G0 is connected to line 306 which is the normal direction input for shutter shift register 303.

When line 348 goes to its logical one state, data selector 350 shifts its outputs A–G to a second set of inputs appearing on inputs A1–G1. Note that A1, B1, and C1 are all tied to the $\phi 1$ clock phase via line 355 and thus, the setting of flip-flop 347 puts the $\phi 1$ phase of clock 316 onto the shift inputs of shift registers 301–303. The direction input from output G of data selector 350 is shifted to input G1 which is tied to a logical zero state. A logical zero on line 349 will condition shift register 303 to shift right.

It will thus be appreciated that the setting of flip-flop 347 changes the state of the SELECT input to data selector 350 and thus connects shift registers 301–303 to a new set of inputs internal to the display storage and control apparatus shown herein and disconnects the shift registers from their normal inputs 304, 305, and 306.

Note that the least significant bit (Q1 output) of state counter 310 appears at both points 317 and 351. From point 351 the Q1 output of counter 310 is provided along line 352 to the enable input of address counter 315. The clock input for address counter 315 is provided along line 355 and is connected to the $\phi 1$ phase of clock 316. Therefore, shift registers 301–303 and address counter 315 are clocked synchronously during the 01 state of state counter 310. When state counter 310 is in a state where its Q1 output equals one (01 and 11) address counter 315 will be enabled and begin to count.

Since NOR gate 345 detects the 01 state of counter 310 and provides a logical one on line 346 during the 01 state, this logical one is also provided on line 356 as one input to NAND gate 357. A second input to NAND gate 357 appears on line 358 and is the $\phi 2$ phase of clock 316. The third input to NAND gate 357 appears on line 359 and carries an inverted $\phi 1$ clock signal from inverter 360. From inspection of FIG. 15C, it will be apparent that lines 358 and 359 will both be logical one only during the third quarter of any $\phi 1$ clock cycle. Therefore, when state counter 310 is in its 01 state upon each occurrence of the third quarter of a $\phi 1$ clock cycle, the output of NAND gate 357 which appears on line 361 will go to a logical zero state for a period equal to one quarter of the period of the clocks.

As may be seen from FIG. 15B, line 361 is tied to the negated write (W) input to RAMS 311–313 and thus, upon the occurrence of line 361 going to its logical zero state, the data present on the DATA IN (DI) input of each of RAMS 311–313 will be written into the particular address selected on the RAM's address inputs. Recall that the two most significant address bits of RAMS 311–313 carry a number corresponding to the latched output of switches 120 and 121. The six lowest address bits of RAMS 311–313 are all tied to a six bit address bus 362 which is driven by the outputs from address counter 315. The DATA IN (DI) inputs for RAMS 311–313 are connected to lines 365–367, respectively. Lines 365–367 carry the sixtieth bit (Q59) of shift registers 301–303, respectively. Thus, each RAM will be conditioned to write the bit about to be shifted out of each of shift registers 301–303.

Consider the positive edge of the $\phi 2$ clock phase which caused state counter 310 to count from 00 to 01. The next negative going edge of the $\phi 1$ clock phase caused flip-flop 347 to set thus connecting the shift registers 301–303 to the internal inputs shown in FIG. 15A and 15B. The logical one on line 352 from the Q1 output of state counter 310 enables address counter 315, but since no positive going edge of the $\phi 1$ phase has occurred, address counter 315 will still be in its zero state. Similarly, since the switching of connections to the shift inputs of shift registers 301–303 occurred on a negative going edge of $\phi 1$, the shift registers have yet to be clocked. Therefore, during the third quarter of this particular $\phi 1$ clock cycle, line 361 will be equal to a logical zero and the bit present at the Q59 output of each of shift registers 301–303 will be written into the zero address of the block of memory selected by lines 340 and 341 of RAMS 311–313, respectively. The next positive transition of the $\phi 1$ clock phase causes shift registers 301–303 to shift placing the next sequential bit on the Q59 output of each shift register and also causes address counter 315 to count to one. During the third quarter of this next $\phi 1$ clock cycle, this second bit is written into the 000001 address of the particular block of RAMS 311–313. This cycle continues as address counter 315 counts and shift registers 301–303 shift right in response to the $\phi 1$ phase of clock 316. It will be apparent that the rightmost bit from shift registers 301–303 is written into the lowest memory address of RAMS 311–313 and thus, the sixtieth bit of each shift register is written into the zero address, the fifty-ninth bit is written into the one address, the fifty-eighth bit is written into the two address and so forth.

When state counter 315 is in its fifty-nine state (111011) the bit of each shift register 301–303 which was leftmost at the beginning of this described cycle is written into the sixtieth (numbered fifty-nine) address location of the block of RAMS 311–313 selected by lines 340 and 341. The writing of this bit occurs during the third quarter of the $\phi 1$ clock cycle the beginning of which caused the address counter 315 to count to fifty-nine.

Upon the next positive going edge of the $\phi 1$ phase, address counter 315 counts to sixty (111100). NAND gate 368 shown in FIG. 15B has four inputs which are tied to the four most significant bits of six bit address bus 362 and thus, NAND gate 368 will detect the sixty address and provide a logical zero output to point 369 in response to detection of the sixty address. Point 369 controls the negated CLEAR input of address counter 315 and thus, address counter 315 is conditioned to clear upon the next positive going edge of the $\phi 1$ phase. It will be understood by those skilled in the art that address counter 315 may be embodied by a pair of TTL type 74162 counters having synchronous negated clear inputs as shown in FIG. 15B.

Point 369 is also connected to line 370 which goes to the control logic of state counter 310. Line 370 is tied to lines 371 and 375. Line 371 provides an input to NAND gate 335. Since the other input to NAND gate 335 is connected to point 331 it will be apparent from the explanation hereinabove of the operation of transition detectors 319 and 328 that point 331 is normally in a logical one state. Since point 372 is carrying the output of NAND gate 368, it will be apparent that point 372 will also normally be at a logical one state except when the sixty address is present on address bus 362. Therefore, the occurrence of the sixty address on address bus 362 will be the first event since the operation of switch S1 which has caused the output of NAND gate 335 to go to a logical one in response to the presence of a logical zero at its input. Therefore the counting of address counter 315 to its sixty (111100) state will enable state counter 310. The next positive going edge of the $\phi 2$ phase of clock 316 causes state counter 310 to count from its 01 to its 10 state. Note from FIG. 15C that this occurs during the second quarter of the $\phi 1$ clock phase and thus before another write signal has appeared on line 361.

The counting of state counter 310 from its 01 to its 10 state causes the output of NOR gate 345 to go to a logical zero since this NOR gate is no longer detecting 01 state. Therefore, a logical zero appears on line 356 as an input to NAND gate 357 and thus line 361 is held to a logical one preventing further writing into RAMS 311–313. It will therefore be apparent that sixty bits from shift registers 301–303 have been written into sixty contiguous addresses of RAMS 311–313 and after the writing of the sixtieth bit, the counting of address counter 315 to its sixty state causes state counter 310 to change from its 01 (writing) state to its 10 state. The Q1 output of state counter 310 which appears at point 317 is in its logical zero state during the 10 state of counter 310. Therefore, a logical zero appears at point 351 as provided along line 352 and thus disables address counter 315.

Address counter 315 of the type (for example the TTL 74162) which will clear in response to the next positive going clock pulse when the negated clear input is equal to zero without regard to the state of any enable inputs to the counter. Therefore, while address counter 315 is disabled, the next positive going transition of the $\phi 1$ clock will clear counter 315.

The clearing of address counter 315 removes the logical zero from point 369 due to the action of NAND gate 368. Since point 369 is connected to point 372, a logical one is reestablished at point 372 and state counter 310 is likewise disabled. Therefore, state counter 310, address counter 315, and the remainder of the circuitry shown in FIGS. 15A and 15B will again be in a stable state waiting for an input from switch S4 in order to change state.

Since the write cycle described above (the 01 state of counter 310) begins upon initiation of an operation to rotate cartridge 70 when the operator depresses switch S1, the counter will write the information from shift registers 301–303, the state counter will count to its 10 state and will wait for the mechanical changing cycle to be completed.

When rotation of cartridge 70 to the next particular cassette 80 from which dictation is to be transcribed has been completed, cartridge 70 will be lowered into position as described hereinabove. The approach of the cartridge into position causes switches 120 and 121 to give a direct binary readout of the number associated with the newly selected cassette.

The lowering of cartridge 70 closes switch S4 which causes positive transition detector 328 to provide a positive pulse on line 329 and thus a negative pulse at point 331. The negative pulse at point 331 enables the state counter 310 as described hereinabove and thus the counter will count from its 10 state to its 11 state.

When state counter 310 counts to its 11 state point 317 is again equal to logical one and thus address counter 315 is again enabled. The negative going pulse at point 331 which appeared in response to closure switch S4 causes latch 338 to latch the new state of switches 120 and 121 on lines 340 and 341 and thus to select the particular block of RAMS 311–313 associated with the new cassette in the record/listen position.

Note that the data input lines for shift register 301–303 are connected to outputs D, E, and F respectively of data selector 350. The D1 input to data selector 350 carries the inverted output of negated DATA OUTPUT (DO) of RAM 311. Similarly, the E1 input of data selector 350 carries the inverted output of the negated DATA OUTPUT (DO) of RAM 312. The inversion of the outputs of RAMS 311 and 312 are necessary because the outputs of the particular RAMS shown in FIG. 15B are the logical inverse of the data written into each address. It will be appreciated by those skilled in the art that random access memories 311–313 may be embodied by currently available random access memories such as a type SN54LS202 currently manufactured by Texas Instruments, Inc.

Thus, so long as flip-flop 347 is in its Q=1 state the inputs to the shift registers will be provided as the output of rams 311–313.

Note that during the 10 state of counter 310, shift registers 301–303 were being continually clocked by the $\phi 1$ phase of clock 316. Since address counter 315 was cleared to zero and disabled during the 10 state, the output of the zero address of a particular block of memory was continually shifted into each of shift registers 301–303. Since it is possible that the zero address contained a logical one, the shift registers could be filled with logical ones during the 10 state of state counter 310 and therefore, it is considered desirable to provide a means of blanking the display during the change cycle. Therefore, the output of line 348 from flip-flop 347 could be used in a manner which will be apparent to those skilled in the art to blank a display (not shown) which is driven by shift registers 301–303.

Since state counter 310 makes its transistion from 10 to 11 on the positive going edge of the $\phi 2$ clock, the next positive going edge of the $\phi 1$ clock will cause the data present at the inputs of shift registers 301–303 to be shifted into the registers. This same positive going edge of the $\phi 1$ clock will cause address counter 315 to count from zero to one. Therefore, upon this particular positive going edge of the $\phi 1$ clock, the bit contained in the zero address location of the particular block of memory determined by lines 340 and 341 will be written into the leftmost flip-flop of shift registers 301–303. When the next positive going edge of the $\phi 1$ clock occurs, the data bit located in the one address of RAMS 311–313 will be written into the leftmost flip-flop of shift registers 301–303 and address counter 315 will count from one to two.

Recall that, when S4 was closed the two bit code for the particular cassette which is being placed in the record/listen position is latched onto lines 340 and 341 and thus the data being shifted into registers 301–303 will correspond to the data last written into RAMS 311 through 313 for the particular newly selected cassette. Note also, that each time a cassette location in the cartridge 70 is removed from the record/listen position, the data in RAMS 311–313 which previously represented a state of the display corresponding to that particular cassette is overwritten by the new more recent data.

The above described sequence of shifting in data from RAMS 311–313 into shift registers 301–303 continues as described hereinabove. Note that the data in the zero address the block of memory of the RAMS associated with the particular selected cassette is written into the shift registers first, and will be continually shifted towards the right until, it appears at the sixtieth location (Q59) of the shift register. Recall that since the leftmost bit is written into the zero location during the write cycle, it will be apparent that the read cycle will shift data into shift registers 301–303 in a correct sequence which corresponds to the data present which was last written out of these registers for the particular selected cassette.

Since address counter 315 started at a zero count, the fifty-nine address (111011) will contain the sixtieth bit. Assume that address counter 315 is in its fifty-nine count. Upon the next positive going transition of the $\phi 1$ clock, the sixtieth bit from the particular block of memory of each RAM 311–313 associated with the selected cassette will be written into the leftmost flip-flop of shift register 301–303. The counting of address counter 315 to its sixty count (111100) is again detected by NAND gate 368 which provides a logical zero to point 369 and thus along line 370. This logical zero is again provided along line 371 to point 372 as an input to NAND gate 335 and thus counter 310 is enabled to count on the next positive going edge of the $\phi 2$ clock.

As will be appreciated by those skilled in the art, state counter 310 may be embodied by a pair of JK flip-flops and associated gating to provide an enable input and thus, will count from 11 to 00 upon the next positive clock transistion. However, state counter 310 may also be embodied by a four bit binary counter such as the TTL74162 using only the two least significant bits. Therefore, the counter can be considered to have counted from 11 to 00 and thus again be in a zero state without regard to the count of the two most significant bits of a 74162 type counter.

Whichever embodiment of state counter 310 is used, the detection of the sixty address by NAND gate 368 again enables the state counter 310 which will go to its 00 state upon the next positive edge of the $\phi 2$ clock.

Since line 370 goes to a logical zero on a positive edge of $\phi 1$, and address counter 315 clears synchronously, line 375 will remain in a logical zero state for one complete $\phi 1$ clock cycle. The next positive going edge of $\phi 2$ causes state counter 310 to count to 00 and thus places logical zeros at points 318 and 351. Therefore, all three inputs to NOR gate 377 will be logical zeros only when state counter 310 is in its 00 state and address counter 315 is in its sixty (111100) state. With all inputs to NOR gate 377 equal to zero, the output on line 380 to the K input of flip-flop 347 becomes one shortly after the positive going edge of the $\phi 2$ clock. Since line 346 is equal to zero because NOR gate 345 is not detecting the 01 state of counter 310, flip-flop 347 is now conditioned to clear upon the next falling edge of the $\phi 1$ clock. This falling edge clears flip-flop 347 thus causing a logical zero to appear on line 348 and changing the state of the select input of data selector 350. Since a sufficient propagation delay is provided by flip-flop 347 and the levels of gating internal to data selector 350, it will be apparent that the $\phi 1$ clock will be in a stable zero state when the normal shift inputs 305 are again connected to the shift inputs of shift registers 301–303.

The next positive going edge of the $\phi 1$ clock clears address counter 315, and thus the display storage and control device shown in FIGS. 15A and 15B is again in a state with state counter 310 equal to 00 and address counter 315 in its zero count. This is the state in which the description of the operation of this apparatus began. It will be apparent from the foregoing, the 00 state of counter 310 is one in which it will remain until it is again disturbed by a logical zero pulse appearing at point 331.

Note that for each RAM 311–313, the memory block associated with each of cassettes 80 which is determined by lines 340 and 341 will always contain data representing the states of shift registers 301–303 at the moment the particular cassette was last removed from the record/listen position.

Thus it will be seen that RAMS 311–313 comprise an addressable memory means for storing data corresponding to the state of a display. Note that state counter 310 counts from 00 to 01 and from 10 to 11 in response to changing the particular select cassette which is to be in the record playback position.

From the foregoing it will be understood that the results provided by the present invention, including the display of parameters of dictation for a particular cassette in the recording or transcribing position, storage of such parameters when such cassette is removed from the recording or transcribing position, and further display and updating of such parameters when such cassette is returned to the recording or transcribing position, can be provided by embodiments of the invention utilizing either the mechanical, the first electrical or the second electrical storage and display means described above. Furthermore, in addition to the disclosed cassette changer apparatus, the invention contemplates the use of any manner of removal and return of a cassette to the record/listen position, including manual handling of the cassette.

The parameter of dictation primarily discussed above in connection with the disclosed embodiments was the position of the recording media with respect to a transducer, that is, the net amount of recording medium wound past the transducer from a reference point. It will be clear to those skilled in the art that many other parameters of dictation can be stored and displayed in the same manner as the position of the medium. For example, the farthest point along the medium at which dictation has been recorded, the location of "end marks" on the medium marking the end of each segment of dictation, the location of marks on the medium marking the presence of instructions in a secondary channel of the medium relating to dictation recorded in the primary channel, and the farthest point along the medium that has been transcribed are illustrative of parameters of dictation the current status of which could be stored and displayed according to the present invention.

It will be understood that a transcribing person may place a cartridge 70 carrying cassettes having dictation recorded thereon in a similar cassette changer apparatus 10 and experience the same convenience and flexibility in transcribing the dictation recorded on the cassettes as a dictating person experiences in recording the dictation on the cassettes. In many instances, it would never be necessary to handle an individual cassette, it being sufficient to handle cartridge 70 containing many individual cassettes 80. However, if it is necessary, for example, to transcribe dictation recorded on a cassette by a remote portable dictating machine, a cassette may easily be removed from the cartridge 70 by grasping it at the location of the cutouts 73 and pulling it out against the inward pressure of the flexible guides 74. The remotely recorded cassette may also be easily slid into the slot and removably maintained in position by the flexible guide 74 and the projections 75 at the ends thereof.

The cassette changer apparatus 10 disclosed herein may also include a means (not shown) for stopping the rotational motion of the cam 23 when the frame 17 is in its raised position. This would provide an "eject" position that would make it more easy to remove or insert the cartridge 70 on the cartridge support member 35. A suitable control circuit for causing the frame 17 to assume an eject position would be included in the dictate or transcribe control. Further circuitry could be included in the dictate control to cause the cartridge 70 to be shifted to a particular orientation whenever the cartridge was moved from the eject or loading position to an operating position. The placement of a particular cassette location in the record/listen position at the beginning of operation would provide a convenient reference for an indexing system utilized in connection with the cassette changer apparatus 10.

It will further be understood that although the preferred embodiment disclosed herein includes a mechanism for rotatably shifting a cartridge 70 containing radially disposed cassettes, other cartridge orientations and means of shifting are within the concept of the present invention. Any mechanism, for example, that changes cassettes by relative motion of the cartridge and the rotatable projections or spindles of the transducer assembly, including motion parallel to the axes of rotation of the projections to withdraw the projections from one cassette, motion generally perpendicular to the axes of the projections to align another cassette with the projections, and motion again parallel to the axes of the projections to insert the projections into the openings of the newly aligned cassette is within the concept of the invention. For example, the cassettes 80 could be disposed linearly along a cartridge, and shifting between cassettes could be accomplished by longitudinal movement of the cartridge with respect to a transducer head assembly. The means for shifting between cassettes could also raise the cartridge to place a cassette in the record/listen position and lower the cartridge during removal thereof, if the recording medium being utilized required vertical movement with respect to rotatable driving projections. Alternately, the transducer assembly itself and the transport deck could be moved relative to the cartridge to provide either one or both of the required motions.

Furthermore, the concept of the present invention is intended to encompass any form of discrete recording media, a plurality of which may be mounted in a cartridge, such as discs.

While this invention has been described in detail with particular reference to a preferred embodiment thereof, it will be understood that variations and modifications can be effected within the spirit and the scope of the invention as described hereinbefore and as defined in the appended claims.

What is claimed is:

1. In a dictation recording apparatus,
   a cartridge means for releasably retaining a first recording medium at a first location and a second recording medium at a second location;
   an indexing means for holding said cartridge and for selectively moving said cartridge from a first position wherein said first location is at a record/listen transducer to a second position wherein said second location is at said transducer, and for selectively returning said cartridge to said first position;

a transport for selectively moving said first recording medium when said cartridge is in said first position and alternately for selectively moving said second recording medium when said cartridge is at said second position;

signal means coupled to said transport for generating one of a plurality of parameter signals in response to each occurrence of a net amount of said first recording medium moving past said record/listen transducer when said cartridge is in said first position;

a storage means connected to said signal means for storing said parameter signals in response to said cartridge being moved from said first position to said second position by said indexing means; and a display means responsive to said indexing means returning said cartridge to said first position for providing a visible display corresponding to said parameter signals stored in said storage means.

2. In a dictation transcribing machine including a plurality of record media;

selection means for selectively placing any one of said plurality of record media in a record/listen position, said record/listen position including a transport and a record/listen transducer;

a display memory;

signal means connected to said display memory, said transport, and said record/listen transducer for providing a first type parameter signal to said display memory in response to a predetermined increment of a first one of said plurality of record media being moved past said transducer and said transducer detecting a prerecorded mark signal in said increment and alternately for providing a second type parameter signal in response to said predetermined increment of said first one of said plurality of record media moving past said transducer in the absence of said transducer detecting one of said prerecorded mark signals;

means for storing said first and second type parameter signals in said display memory as said parameter signals are provided;

a display connected to said display memory for displaying said parameter signals stored in said display memory;

an addressable memory operatively connected to said display memory for storing a plurality of sets of said parameter signals; and memory control means for writing a first set of said plurality of sets of parameter signals from said display memory into a first block of said addressable memory in response to said selection means removing said first one of said plurality of record media from said operative position and for writing a second set of said plurality of sets of parameter signals into said display memory from a second block of said addressable memory in response to said selection means placing a second one of said plurality of record media in said operative position.

3. In a dictation recording/transcribing machine including a means for selectively receiving a plurality of record media at a record/listen position said record/listen position including a record/listen transducer and a transport;

selection signal means for providing a plurality of selection signals in response to said record media being at said record/listen position; each of said selection signals corresponding to a particular one of said record media;

parameter signal means connected to said transport for providing parameter signals in response to each occurence of a predetermined increment of said one of said plurality of record media being moved past said record/listen transducer at said record/listen position;

a display memory connected to said parameter signal means for storing said parameter signals;

a display connected to said display memory for displaying said parameter signals stored in said display memory;

an addressable memory operatively connected to said display memory for storing a plurality of sets of said parameter signals; and memory control means for writing a first set of said plurality of sets of parameter signals from said display memory into a first block of said addressable memory in response to termination of a first one of said selection signals and for writing a second set of said parameter signals from a second block of said addressable memory into said display memory in response to an occurrence of a second one of said selection signals.

4. A dictation recording/transcribing machine according to claim 3 wherein said addressable memory is characterized by an address bus comprising at least one address block line responsive to said selection signals and a plurality of address lines responsive to an address counter.

5. In a dictation recording/transcribing machine including a means for selectively receiving a plurality of record media at a record/listen position, one at a time, in response to a plurality of selection signals; each of said selection signals corresponding to one of said record media;

said dictation recording/transcribing machine including a transport at said record/listen position for driving one of said record media past a record/listen transducer;

parameter signal means for providing parameter signals in response to a predetermined increment of said one of said plurality of record media being moved past said record/listen transducer at said record/listen position by said transport;

a plurality of memory blocks for storing a plurality of sets of said parameter signals;

a display connected to each of said memory blocks for displaying said parameter signals stored in one of said memory blocks;

display control means for enabling a first one of said plurality of memory blocks to operate said display in response to a first one of said selection signals and alternately for enabling a second one of said plurality of memory blocks to operate said display in response to a second one of said selection signals.

6. A dictation recording/transcribing machine according to claim 5 wherein said display is characterized by an input bus for receiving said parameter signals;

each of said memory blocks comprises an output port connected to said input bus alternately and selectively placeable in a connected state and a high impedance state;

said output port of said first one of said plurality of memory blocks is placed in said connected state and the output ports of remaining ones of said plurality of memory blocks are placed in said high impedance state in response to said first one of said selection signals.

7. A method of recording dictation comprising the steps of:

providing a carrier for a plurality of recording media;

selectively indexing said carrier to place one of said plurality of recording media in a recording position;

recording dictation on one of said plurality of recording media in said recording position;

concurrent with the step of recording dictation, providing parameter signals upon each occurrence of a predetermined increment of said one of said plurality of record media being moved past a record/listen transducer at said recording position and storing said parameter signals as stored parameter signals in a first memory;

storing said stored parameter signals in a second memory in response to said one of said plurality of recording media being removed from said recording position; and returning said stored parameter signals to said first memory and displaying said stored parameter signals when said one of said plurality of recording media is returned to said recording position.

* * * * *